US010745616B2

(12) United States Patent
Zych et al.

(10) Patent No.: US 10,745,616 B2
(45) Date of Patent: Aug. 18, 2020

(54) PHOSPHORS AND PHOSPHOR-CONVERTED LEDS

(71) Applicant: MERCK PATENT GMBH, Darmstadt (DE)

(72) Inventors: Aleksander Zych, Darmstadt (DE); Mathias Rapphahn, Greifswald (DE); Ralf Petry, Griesheim (DE); Ingo Koehler, Darmstadt (DE); Andreas Benker, Lautertal (DE); Stefan Tews, Greifswald (DE)

(73) Assignee: MERCK PATENT GMBH, Darmstadt (DE)

( * ) Notice: Subject to any disclaimer, the term of this patent is extended or adjusted under 35 U.S.C. 154(b) by 344 days.

(21) Appl. No.: 15/560,602

(22) PCT Filed: Mar. 2, 2016

(86) PCT No.: PCT/EP2016/000361
§ 371 (c)(1),
(2) Date: Sep. 22, 2017

(87) PCT Pub. No.: WO2016/150547
PCT Pub. Date: Sep. 29, 2016

(65) Prior Publication Data
US 2018/0066186 A1 Mar. 8, 2018

(30) Foreign Application Priority Data
Mar. 24, 2015 (EP) .................................. 15000870

(51) Int. Cl.
*C09K 11/77* (2006.01)
*H01L 33/50* (2010.01)
(Continued)

(52) U.S. Cl.
CPC ...... *C09K 11/7792* (2013.01); *C09K 11/0883* (2013.01); *C09K 11/59* (2013.01);
(Continued)

(58) Field of Classification Search
CPC ............ C09K 11/7792; C09K 11/0885; C09K 11/7734; C09K 11/59; C09K 11/64; H01L 33/504
See application file for complete search history.

(56) References Cited

U.S. PATENT DOCUMENTS

| 8,017,035 B2 | 9/2011 | Wang et al. |
| 2010/0090585 A1* | 4/2010 | Seto ................ C04B 35/16 313/503 |
| 2014/0055982 A1 | 2/2014 | Tao |

FOREIGN PATENT DOCUMENTS

| CN | 101243158 A | 8/2008 |
| WO | 07005486 a2 | 1/2007 |
| WO | 2007005486 A2 | 1/2007 |

OTHER PUBLICATIONS

International Search Report PCT/EP2016/000361 dated May 19, 2016.
(Continued)

*Primary Examiner* — C Melissa Koslow
(74) *Attorney, Agent, or Firm* — Millen, White, Zelano and Branigan, P.C.

(57) ABSTRACT

The present invention relates to alkaline earth aluminate phosphors, to a process for the preparation thereof and to the use thereof as conversion phosphors. The present invention also relates to an emission-converting material comprising at least the conversion phosphor according to the invention, and to the use thereof in light sources, in particular pc-LEDs (phosphor converted light emitting devices). The present invention furthermore relates to light sources, in particular pc-LEDs, and to lighting units which comprise a primary light source and the emission-converting material according to the invention.

17 Claims, 5 Drawing Sheets

(51) Int. Cl.
*C09K 11/08* (2006.01)
*C09K 11/59* (2006.01)
*H01J 61/44* (2006.01)
*C09K 11/64* (2006.01)
*H01J 11/42* (2012.01)

(52) U.S. Cl.
CPC .......... *C09K 11/7734* (2013.01); *H01J 61/44* (2013.01); *H01L 33/502* (2013.01); *C09K 11/64* (2013.01); *H01J 11/42* (2013.01); *H01L 33/504* (2013.01)

(56) References Cited

OTHER PUBLICATIONS

Jansen S R et al: "Eu-Doped Barium Aluminum Oxynitride with the ss-Alumina-Type Structure as New Blue-Emitting Phosphor", Journal of the Electrochemical Society, Electrochemical Society, vol. 146, No. 2, Jan. 1, 1999 (Jan. 1, 1999), pp. 800-806, XP002590721, ISSN: 0013-4651, DOI: 10.1002/CHIN.199921265.

Valerie Pike et al: "Defect chemistry and VUV optical properties of the BaMgAl10O17:Eu2+−Ba0.75Al11O17.25: Eu2+ solid solution", Journal of Solid State Chemistry, vol. 173, No. 2, Jul. 1, 2003 (Jul. 1, 2003), US, pp. 359-366, XP055270841, ISSN: 0022-4596, DOI: 10.1016/S0022-4596(03)00111-7.

A.L.N. Stevels, J. of Luminescence, vol. 17, 1978, pp. 121-133.

Feng Li et al., "Concentration Effect of Mn2+ on the Luminescence Properties of Ba0.75Al11O17.25:Mn2+", Electrochemical and Solid-State Letters, vol. 9, pp. J24-J26, published on Dec. 31, 2006.

Text of the First Office Action in corresponding Chinese Patent Application No: 201680017262.6 dated Mar. 18, 2020 (pp. 1-6).

A.L.N. Stevels, "Effect of Non-Stoichiometry on the Luminescence of Eu2+-Doped Aluminates With the β-Alumina-Type Crystal Structure", Journal of Luminescence, vol. 17, pp. 121-133, published on Dec. 31, 1978.

\* cited by examiner

PHOSPHORS AND PHOSPHOR-CONVERTED LEDS

The present invention relates to alkaline earth aluminate phosphors, to a process for the preparation thereof and to the use thereof as conversion phosphors. The present invention also relates to an emission-converting material comprising at least the conversion phosphor according to the invention, and to the use thereof in light sources, in particular pc-LEDs (phosphor converted light emitting devices). The present invention furthermore relates to light sources, in particular pc-LEDs, and to lighting units which comprise a primary light source and the emission-converting material according to the invention.

Phosphor converted light emitting diodes (LEDs) or pc-LEDs are currently the prime candidates for solid state lighting (SSL). This is due to their energy saving properties where a high brightness can be achieved applying small electrical powers compared to other lighting devices. Also their compactness allows for smaller amounts of the phosphors to be used compared to e.g. fluorescent tubes. Furthermore, the final product, the LED lamp, may be used in ways not possible before from architectural point of view.

There are in principle three different approaches to obtaining white-emitting inorganic LEDs by additive colour mixing:

(1) RGB LEDs (red+green+blue LEDs), in which white light is generated by mixing the light from three different light-emitting diodes, which emit in the red, green and blue spectral region.

(2) Complementary systems, in which an emitting semiconductor (primary light source) emits, for example, blue light, which excites one or more phosphors (conversion phosphors) which then emit light of a longer wavelength. The white LEDs used today are mainly based on a concept where a blue LED chip ((In)GaN, emitting at around 440-480 nm, depending on the amount of In doping in the material) is covered by a phosphor layer. A part of the light emitted by the chip is transmitted giving a blue component and the rest is absorbed by the phosphor layer, yielding the phosphor emission. By mixing the blue and yellow light, white light is then produced. Alternatively, it is possible to use two or more phosphors which emit, for example, green or yellow and orange or red light.

(3) UV- or violet LED+RGB phosphor, in which a semiconductor, which emits in the near-UV or violet region of the spectrum (primary light source) emits light to the environment, in which three different conversion phosphors are excited to emit in the red, green and blue spectral region. Alternatively, it is possible to use two different phosphors which emit yellow or orange and blue.

Binary complementary systems have the advantage that they are capable of producing white light with only one primary light source and—in the simplest case—with only one conversion phosphor. The best-known of these systems consists of an indium aluminium gallium nitride chip as primary light source, which emits light in the blue spectral region, and a cerium-doped yttrium aluminium garnet (YAG:Ce) as conversion phosphor, which is excited in the blue region and emits light in the yellow spectral region. Some ortho-silicates $M_2SiO_4:Eu^{2+}$ (M=Ca, Sr, Ba) can also be used as yellow-orange emitters. However, the quality of light obtained through mixing of blue and yellow components is low due to the fact that there is a lack of red component in the overall emission. Improvements are obtained by addition of a red component, such as various nitrides and oxy-nitrides, doped with divalent europium or trivalent cerium ions, such as $M_2Si_5N_8:Eu^{2+}$ (M=Sr, Ba). However, the use of blue-emitting indium gallium nitride LEDs also results in a number of difficulties, such as the strong dependence of the colour point on the thickness of the phosphor layer and the strong spectral interaction between the luminophores owing to the small Stokes shift. Furthermore and even more important, deviations in the blue peak emission wavelength of the LED chip of as little as 2 nm lead to significant changes in the colour points. Therefore, such a system is very sensitive to small variations of the emission of the blue LED chip.

The requirements put on the phosphors used are generally as follows:
1. high color rendering index (CRI) for good light quality,
2. high thermal stability (no significant emission intensity decrease at operating temperatures of T>150° C.),
3. high quantum efficiency (QE) of the phosphor,
4. high absorption of the phosphor at 440-460 nm (the emission wavelength of the blue LED chip),
5. high chemical stability.

An interesting alternative comes into play recently where the blue emitting LED chip is replaced by a near-UV or violet LED chip. In particular, the emission range between 370 and 430 nm is of interest, since the Stokes loss here on conversion into a white spectrum is not yet too great. An advantage of such a configuration, especially when employing a violet LED chip, is that the violet chip has a much better performance as a function of operating temperature as compared to the blue chip. This effect is known in the literature as "operating temperature droop". Furthermore, the influence of the deviation of the wavelength of the near-UV or violet chip is insignificant for the colour point of the final LED, as the complete emission of the near-UV or violet chip is converted to light of longer wavelength. Already these advantages are important enough to investigate phosphors for near-UV and violet LED chips.

Accordingly, near-UV and violet LEDs as the basis for white-emitting LEDs are the focus of a number of developments of LED light sources, and the research and development of novel conversion phosphors for near-UV and violet LEDs has been intensified in recent years. For this reason, inorganic fluorescent powders which can be excited in the near-UV and violet region of the spectrum are also, in particular, increasing more and more in importance today as conversion phosphors for light sources, in particular for pc-LEDs.

It is therefore an object of the present invention to provide novel compounds, which can be excited in the near-UV or violet region. It would be in particular desirable to provide green-emitting phosphors, which show strong absorption in the near-UV or violet region, but little or no absorption in the blue region of the spectrum as this facilitates the mixing of the colours to achieve the correct colour point and avoids several sequential absorption and emission processes, which will lower the emission efficiency. Preferably, those phosphors should show a high emission efficiency.

A further object of the present invention is the provision of phosphors which have a plurality of emission maxima, meaning that fewer different phosphors are necessary for the generation of white light on excitation in the UV region.

Surprisingly, it has been found that the alkaline earth aluminate phosphors described below where luminescence is obtained from divalent europium (Eu) ions or other dopants achieve this object. These phosphors can be excited in the near-UV and violet region and exhibit emission in various parts of the spectral region. The emission of the phosphor under excitation at 410 nm spans from 420-700 nm, with a peak maximum being in the green spectral region around 520 nm, depending on the exact composition. The material is derived from a β-alumina structure of the composition $Ba_{0.75}Al_{11}O_{17.25}$.

The Ba-aluminate material of the β-alumina structure in its pure form and with a $Eu^{2+}$ doping is known for several year (A. L. N. Stevels, J. of Luminescence 17 (1978), 121-133; S. R. Jansen, J. M. Migchels, H. T. Hintzen, R. Metselaar, *J. Electrochem. Soc.* 146 (2) (1999) 800-806; V. Pike, S. Patraw, A. L. Diaz, B. G. DeBoer, *J. Solid State Chem.* 173 (2003) 359-366). Its composition varies as $Ba_{1-n}Al_{10.66(6)+4/3n}O_{17+n}$, where n varies from 0 to 0.35. Furthermore, compositions seemingly outside of this range might be valid as sometimes the stoichiometry is normalised to $Ba_1$. From the formula given, a composition of $Ba_{0.75}Al_{11}O_{17.25}$ can be derived for n=0.25. Also other variations leading to Ba-rich compositions are known, though these have a β'-alumina structure, sometimes also called magneto-plumbite structure. In such compositions, only blue luminescence is observed. The material (β-alumina) and its luminescence properties have been investigated with respect to its use in fluorescent lighting where UV light of 254 nm is converted to visible radiation. Upon such stimulation, the material emits blue light and some compositions might also yield a certain amount of green luminescence in addition to the blue light. However, the green emission has been described in the literature as not efficient with a quantum efficiency of only up to about 40%, which is said to be the internal limit of the material.

It is therefore a further object of the present invention to provide green-emitting phosphor materials, which show a higher luminescence efficiency compared to the prior art.

The present invention relates to a compound of the following formula (1),

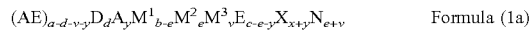   Formula (1)

where the following applies to the symbols and indices used:
AE is selected from the group consisting of Ca, Sr, Ba or mixtures of these elements;
D is selected from the group consisting of Eu, Mn, Yb, Sm, Ce or mixtures of these elements;
A is selected from the group consisting of Na, K or mixtures of these elements;
$M^1$ is selected from the group consisting of B, Al, Ga, In, Tl, Sc or mixtures of these elements;
$M^2$ is selected from the group consisting of C, Si, Ge, Sn or mixtures of these elements;
$M^3$ is selected from the group consisting of Y, Lu, La or mixtures of these elements;
E is selected from the group consisting of O, S, Se, Te or mixtures of these elements;
X is selected from the group consisting of F, Cl, Br, I or mixtures of these elements;
N is a trivalent nitride ion;
$0.65 \leq a \leq 1$;
$0 \leq y \leq 0.1a$ where a is as defined above;
$0 \leq v \leq 0.1a$ where a is as defined above;
$10.667 \leq b \leq 11.133$;
$17.00 \leq c \leq 17.35$;
$0 \leq x \leq 5$;
$0 \leq e \leq 5$;
$0.0584 \leq a/b \leq 0.0938$;
$0.0375 \leq a/c \leq 0.0588$;
$2a+3b=2c+x$;
with the proviso that $x \neq 0$ or $y \neq 0$ or $v \neq 0$ or $e \neq 0$ when AE=Ba and $M^1$=Al.

The condition given above for the ratio of a/b and a/c ensures that the inventive compound is formed in the β-alumina phase and is derived from a β-alumina structure of the composition $Ba_{0.75}Al_{11}O_{17.25}$, as proven by X-ray powder diffraction techniques. As can be seen from the data presented in the following experimental section, the inventive materials show a pure $Ba_{0.75}Al_{11}O_{17.25}$ structure of β-alumina, also when comprising alkali metals A or trivalent metals $M^3$ or halide anions X or when modified with for example $Sc^{3+}$ or other trivalent cations in place of $Al^{3+}$ or with $Si^{4+}$ and $N^{3-}$ in place of $Al^{3+}$ and $O^{2-}$, respectively.

The dopant D is incorporated at the lattice site of the alkaline earth metal AE. If D is a bivalent cation, such as $Eu^{2+}$, it directly replaces an alkaline earth metal AE. If D is a trivalent metal, such as $Ce^{3+}$, it replaced an alkaline earth metal AE, and the additional charge of the trivalent metal is either compensated by the incorporation of addition oxygen in the lattice or by a lower ratio of alkaline earth metal.

Preferred are compounds of the following formula (1a),

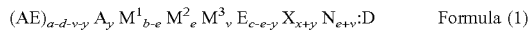   Formula (1a)

where the symbols and indices have the meanings mentioned above and furthermore $0<d \leq 1$.

If the inventive compounds comprise Se or Te as the element E, these elements are preferably present in a total amount of ≤1 atom-% with respect to all elements E, more preferably in a total amount of ≤0.1 atom-% with respect to all elements E. Preferably, the inventive compounds do not comprise Se or Te.

If the inventive compounds comprise Br or I as the element X, these elements are preferably present in a total amount of ≤1 atom-% with respect to all elements X, more preferably in a total amount of ≤0.1 atom-% with respect to all elements X. Preferably the inventive compounds do not comprise Br or I.

The compounds according to the invention can be excited in the near-UV and/or violet spectral region, preferably at about 370-430 nm, and usually exhibit emission maxima in the blue or green spectral region, depending on the exact composition. Depending on the dopant D, an additional emission peak in the red region is possible, e.g. if a combination of $Eu^{2+}$ and $Mn^{2+}$ or $Eu^{2+}$ and $Eu^{3+}$ is used as the dopant D.

In the context of this application, UV light denotes light whose emission maximum is ≤400 nm, near UV light denotes light whose emission maximum is between 370 and 400 nm, violet light denotes light whose emission maximum is between 401 and 430 nm, blue light denotes light whose emission maximum is between 431 and 470 nm, cyan-coloured light denotes light whose emission maximum is between 471 and 505 nm, green light denotes light whose emission maximum is between 506 and 560 nm, yellow light denotes light whose emission maximum is between 561 and 575 nm, orange light denotes light whose emission maximum is between 576 and 600 nm and red light denotes light whose emission maximum is between 601 and 700 nm.

In a preferred embodiment of the present invention, AE is selected from the group consisting of Ba or a mixture of Ba and Sr or a mixture of Ba and Ca. In a particularly preferred embodiment, AE is selected from the group consisting of Ba or a mixture of Ba and Sr or a mixture of Ba and Ca, which comprises a maximum of 10 atom-% of Sr or Ca, respectively, particularly preferably a maximum of 5 atom-% of Sr or Ca, respectively, most preferred a maximum of 3 atom-% of Sr or Ca, respectively, with respect to the total content of AE. AE particularly preferably stands for Ba.

If the inventive compound comprises an element $M^3$, it is preferred that AE stands for Ba only.

In a preferred embodiment of the present invention, the dopant D is selected from the group consisting of Eu, Mn or mixtures of these elements. In a particularly preferred embodiment, D is selected from the group consisting of Eu or a mixture of Eu and Mn, which comprises a maximum of 10 atom-% of Mn with respect to the total amount of AE+Eu+Mn. D particularly preferably stands for Eu.

A preferred embodiment of compounds of formula (1) is therefore the compounds of the following formulae (2) to (7), $$(Ba_{1-z}Sr_z)_{a-d-y}Eu_dA_yM^1_{b-e}M^2_eE_{c-e-y}X_{x+y}N_e \quad \text{Formula (2)}$$

$$(Ba_{1-z}Sr_z)_{a-d-y}(Eu,Mn)_dA_yM^1_{b-e}M^2_eE_{c-e-y}X_{x+y}N_e \quad \text{Formula (3)}$$

$$(Ba_{1-z}Sr_z)_{a-d-y}Eu_dA_yM^1_{b-e}M^2_eE_{c-e-y}X_{x+y}N_e \quad \text{Formula (4)}$$

$$(Ba_{1-z}Sr_z)_{a-d-y}(Eu,Mn)_dA_yM^1_{b-e}M^2_eE_{c-e-y}X_{x+y}N_e \quad \text{Formula (5)}$$

$$Ba_{a-d-v-y}Eu_dA_yM^1_{b-e}M^2_eM^3_vE_{c-e-y}X_{x+y}N_{e+v} \quad \text{Formula (6)}$$

$$Ba_{a-d-v-y}(Eu,Mn)_dA_yM^1_{b-e}M^2_eM^3_vE_{c-e-y}X_{x+y}N_{e+v} \quad \text{Formula (7)}$$

where the symbols and indices have the meanings given above and
$0 \leq z \leq 0.1$, preferably 0.05, particularly preferably 0.03; $0 < d \leq 1$.

In a most preferred embodiment of the invention, $z=0$.

In a further preferred embodiment of compounds according to formula (1) to (7), the alkali metal A is selected from Na or K, preferably K. The index y, which describes the content of the alkali metal A, preferably selected in the range $0 \leq y \leq 0.05a$, particularly preferably $0 \leq y \leq 0.03a$ where a has the meanings described above.

In a further preferred embodiment of the invention, $M^1$ is selected from the group consisting of B, Al, Ga, In, Sc or mixtures of two of these elements where preferably $M^1$ contains Al. Particularly preferred, $M^1$ is selected from the group consisting of Al or mixtures of Al with Ga or Al with In. Very particularly preferred, $M^1$ is Al. If $M^1$ contains elements other than Al, such as B, Ga, In and/or Sc, the total amount of these elements is preferably $\leq 10$ atom-% of the total amount of $M^1$, particularly preferably $\leq 5$ atom-%, most preferred 3 atom-%.

A preferred embodiment of the compounds of formula (1) is therefore the compounds of formula (8) to (11), $$(AE)_{a-d-v-y}D_dA_y(Al_{1-w}B_w)_{b-e}M^2_eM^3_vE_{c-e-y}X_{x+y}N_{e+v} \quad \text{Formula (8)}$$

$$(AE)_{a-d-v-y}D_dA_y(Al_{1-w}Ga_w)_{b-e}M^2_eM^3_vE_{c-e-y}X_{x+y}N_{e+v} \quad \text{Formula (9)}$$

$$(AE)_{a-d-v-y}D_dA_y(Al_{1-w}In_w)_{b-e}M^2_eM^3_vE_{c-e-y}X_{x+y}N_{e+v} \quad \text{(Formula 10)}$$

$$(AE)_{a-d-v-y}D_dA_y(Al_{1-w}Sc_w)_{b-e}M^2_eM^3_vE_{c-e-y}X_{x+y}N_{e+v} \quad \text{Formula (11)}$$

where the symbols and indices have the meanings given above and
$0 \leq w \leq 0.1$; $0 < d \leq 1$.

In a preferred embodiment of the invention, $0 \leq w \leq 0.05$, particularly preferred $0 \leq w \leq 0.03$, most preferred $w=0$.

In a further preferred embodiment of the invention, the following applies to the index d in the compounds of the formulae (1a) to (11): $0.03 \leq d \leq 0.25$, preferably $0.05 \leq d \leq 0.20$.

If the inventive compounds comprise a trivalent element $M^3$, this element is preferably La. In a most preferred embodiment of the invention, no trivalent element $M^3$ is present, i.e. $v=0$. The trivalent element $M^3$ replaces an alkaline earth metal AE. The charge is compensated by a trivalent nitride anion $N^{3-}$.

In inventive compounds, a trivalent element $M^1$ and a divalent anion E can be replaced by a tetravalent element $M^2$ and a trivalent nitride anion $N^{3-}$. If a tetravalent element $M^2$ is present, $M^2$ is preferably selected from the group consisting of Si, Ge or mixtures thereof, particularly preferably Si. The content of $M^2$ is described by the index e. In a preferred embodiment of the invention, the following applies for the index e: $0 \leq e \leq 1$, particularly preferably $0 \leq e \leq 0.2$. In a most preferred embodiment of the invention, $e=0$.

In a further preferred embodiment of the invention, the divalent anion E is selected from the group consisting of O, S or mixtures of the elements. Particularly preferred, E is O.

In a further preferred embodiment of the invention, the inventive compound comprises a monovalent anion X. If a monovalent anion X is present, X is preferably selected from the group consisting of F, Cl or mixtures thereof, particularly preferably F. It is either possible that a monovalent alkali metal A and a monovalent anion X replace an alkaline earth metal AE and a divalent anion E, and/or that the charge of the monovalent anion X is compensated by a lower content of the alkaline earth metal AE, and/or that a part of the divalent anions E is replaced by two monovalent anions X.

It has been found that the presence of X leads to particularly improved properties of the phosphor, in particular a higher efficiency compared to phosphors, which do not comprise any anions X. It is therefore preferable that the inventive compounds according to formula (1) as well as the preferred formulae (2) to (11) comprise a monovalent anion X, in particular F, i.e. that the index $x \neq 0$ and/or $y \neq 0$. In a preferred embodiment of the invention, the following applies for the index x: $0 < x+y \leq 2$, preferably $0.0005 \leq x+y \leq 1$, particularly preferably $0.001 \leq x+y \leq 0.1$, most preferred $0.001 \leq x+y \leq 0.05$.

In a preferred embodiment of the invention, the following applies for the index a: $0.70 \leq a \leq 0.80$. From the condition for the ratio of a:b and a:c given above, the following then applies for the indices b and c:
$10.93 \leq b \leq 11.067$, and
$17.2 \leq c \leq 17.3$.

In a particularly preferred embodiment of the invention, the preferences given above apply simultaneously.

Particularly preferred embodiments of the invention are therefore the compounds of the formulae (2a) to (11a)

$$(Ba_{1-z}Sr_z)_{a-d-y}Eu_dA_yM^1_{b-e}M^2_eO_{c-e-y}F_{x+y}N_e \quad \text{Formula (2a)}$$

$$(Ba_{1-z}Sr_z)_{a-d-y}(Eu,Mn)_dA_yM^1_{b-e}M^2_eO_{c-e-y}F_{x+y}N_e \quad \text{Formula (3a)}$$

$$(Ba_{1-z}Sr_z)_{a-d-y}Eu_dA_yM^1_{b-e}M^2_eO_{c-e-y}F_{x+y}N_e \quad \text{Formula (4a)}$$

$$(Ba_{1-z}Sr_z)_{a-d-y}(Eu,Mn)_dA_yM^1_{b-e}M^2_eO_{c-e-y}F_{x+y}N_e \quad \text{(Formula 5a)}$$

$$Ba_{a-d-v-y}Eu_dA_yM^1_{b-e}M^2_eM^3_vO_{c-e-y}F_{x+y}N_{e+v} \quad \text{Formula (6a)}$$

$$Ba_{a-d-v-y}(Eu,Mn)_dA_yM^1_{b-e}M^2_eM^3_vO_{c-e-y}F_{x+y}N_{e+v} \quad \text{Formula (7a)}$$

$$(AE)_{a-d-v-y}D_dA_y(Al_{1-w}B_w)_{b-e}M^2_eM^3_vO_{c-e-y}F_{x+y}N_{e+v} \quad \text{Formula (8a)}$$

$$(AE)_{a-d-v-y}D_dA_y(Al_{1-w}Ga_w)_{b-e}M^2_eM^3_vO_{c-e-y}F_{x+y}N_{e+v} \quad \text{Formula (9a)}$$

$$(AE)_{a-d-v-y}D_dA_y(Al_{1-w}In_w)_{b-e}M^2_eM^3_vO_{c-e-y}F_{x+y}N_{e+v} \quad \text{Formula (10a)}$$

$$(AE)_{a-d-v-y}D_dA_y(Al_{1-w}Sc_w)_{b-e}M^2_eM^3_vO_{c-e-y}F_{x+y}N_{e+v} \quad \text{Formula (11a)}$$

where the symbols and indices have the following meanings:
AE is selected from the group consisting of Ba or mixtures of Ba with Ca or Ba with Sr where the maximum amount of Ca or Sr, respectively, is 10 atom-% with respect to the total amount of AE+D;
D is selected from the group consisting of Eu or a mixture of Eu and Mn;
A is selected from K or a mixture of K and Na where the maximum amount of Na with respect to the total amount of K and Na is 10 atom-%;
$M^1$ is selected from the group consisting of B, Al, Ga, In, Sc or mixtures of two of these elements, preferably Al, Ga, In or mixtures of two these elements;
$M^2$ is selected from the group consisting of Si, Ge or mixtures of these elements;
$M^3$ is selected from the group consisting of Y, Lu and La;
O is a divalent oxygen anion;
$0.70 \leq a \leq 0.80$;
$0 \leq z \leq 0.05$;
$0.03 \leq d \leq 0.25$;
$10.93 \leq b \leq 11.067$;
$17.2 \leq c \leq 17.3$;
with the proviso that $x \neq 0$ or $y \neq 0$ or $e \neq 0$ when $z=0$ and $M^1$=Al in formulae (2a) to (5a);
and furthermore with the proviso that $x \neq 0$ or $y \neq 0$ or $v \neq 0$ or $e \neq 0$ when $M^1$=Al in formulae (6a) and (7a);
and furthermore with the proviso that $x \neq 0$ or $y \neq 0$ or $v \neq 0$ or $e \neq 0$ when AE=Ba and w=0 in formulae (8a) to (11a).

The remaining symbols and indices have the meanings described above. In a preferred embodiment of formulae (2a) to (11a) the following applies for the indices x and y: $0.0005 \leq x+y \leq 1$, preferably $0.001 \leq x+y \leq 0.1$, most preferred $0.001 \leq x+y \leq 0.05$.

In a particularly preferred embodiment of the compounds according to formulae (2a) to (11a), the used symbols and indices have the following meanings:
AE is Ba;
D is Eu;
A is K;
$M^1$ is Al;
$M^2$ is selected from the group consisting of Si or Ge;
$M^3$ is La;
X is F;
$0.0005 \leq x+y \leq 1$, preferably $0.001 \leq x+y \leq 0.1$, most preferred $0.001 \leq x+y \leq 0.05$;
the remaining symbols and indices have the meanings given above.

In a particularly preferred embodiment of the invention, the inventive compounds can be described by the following formula (12):

  Formula (12)

where the used symbols and indices have the meanings given above.

In a particularly preferred embodiment of the invention, the index e=0 and the inventive compounds are selected from the compounds of the following formula (13),

  Formula (13)

where the used symbols and indices have the meanings given above.

The present invention furthermore relates to a process for the preparation of a compound of the formula (1) or the preferred embodiments, comprising the steps:
a) preparation of a mixture comprising AE, D, $M^1$, E, optionally X and/or optionally A and/or optionally $M^2$ and/or $M^3$ and/or optionally N; and
b) calcination of the mixture at elevated temperature.

The ions AE, A and $M^1$ here are preferably employed in the form of the corresponding carbonates, oxides, halides and/or oxalates. If the divalent anion differs from O, AE, A and/or $M^1$ can also be employed in the form of the corresponding sulfides, sulfates, selenides or tellurides. Preference is given to the use of carbonates. If the inventive compounds comprise a halogen ion X, parts of AE, A and/or $M^1$ can also be used in form of the corresponding halides, such as $(AE)X_2$, AX and/or $M^1X_3$, in particular $(AE)F_2$, AF and/or $M^1F_3$. These halides act simultaneously as the flux in the mixture.

The dopant D is preferably used in form of the oxide or the oxalate. For D=Eu, preference is given to the use of Eu in the form of the oxide $Eu_2O_3$. If D=Mn, preference is given to the use of Mn in the form of the oxalate, in particular as hydrate $MnC_2O_4 \cdot 2H_2O$. Alternatively, Mn can also be employed in the form of the carbonate $MnCO_3$. If the inventive compound comprises a halide X, it is also possible to use the dopant D in form of the halide, such as $EuX_2$ or $EuX_3$, in particular $EuF_2$ or $EuF_3$.

If the inventive compound comprises $M^2$ and/or $M^3$ and N, preference is furthermore given to the use of the corresponding nitrides, such as Si in the form of the nitride $Si_3N_4$ and/or Y, Lu and/or La in the form of YN, LuN and/or LaN.

Furthermore, high purity metals can be used, such as metallic Si.

The ratio of AE, $M^1$, D, E and optionally X and/or optionally $M^2$ and/or optionally A and/or optionally $M^3$ and/or optionally N in the mixture in step a) of the process according to the invention arises from the desired stoichiometry of the reaction product, i.e. the starting materials are preferably employed in accordance with the desired ratio in the product.

The mixture in step a) is preferably prepared in a mortar or on a rolling bench. This process can be performed in a solvent, such as acetone or an alcohol, in particular ethanol, propanol or isopropanol. On an industrial scale, the mixture in step a) is preferably prepared in an automatic mortar mill or on a rolling bench.

The mixture is dried before the calcination. This is preferably carried out in air, initially at room temperature and then in a drying cabinet at elevated temperature, preferably at 60-120° C., in particular at about 80° C.

It may be preferred here to add a fluxing agent to the mixture. Suitable fluxing agents are, for example, boric acid $H_3BO_3$, ammonium fluoride $NH_4F$, aluminum fluoride $AlF_3$, barium fluoride $BaF_2$, strontium fluoride $SrF_2$, calcium fluoride $CaF_2$, sodium fluoride NaF and potassium fluoride KF. Residues of the fluxing agent may also remain in the product.

The calcination of the mixture in step b) of the process according to the invention is preferably carried out under reducing or at least under non-oxidising conditions. Preference is given here to a reaction time of 3 to 24 h, particularly preferably 5 to 16 h, and a temperature in the range from 1100 to 1700° C., particularly preferably from 1300 to 1600° C. It is also possible to perform this process in the air or in an atmosphere comprising oxygen. This can result in partial oxidation of the Eu dopant from $Eu^{2+}$ to $Eu^{3+}$ giving rise to an additional emission in the red region of the spectrum.

The non-oxidising or reducing conditions are established here, for example, using inert gases, ammonia, carbon monoxide, forming gas or hydrogen or vacuum or an oxygen-deficient atmosphere. Preference is given to a forming-gas atmosphere, in particular having a content of 5 to 90% by vol. of $H_2$ in $N_2$.

The calcination can be carried out, for example, by introducing the resultant mixtures into a high-temperature furnace in a boron nitride or corundum vessel. The high-temperature furnace is in a preferred embodiment a muffle furnace or a chamber furnace.

It is preferred for the compounds according to the invention to be comminuted, for example by grinding in a mortar, after the calcination step.

The average particle size $d_{50}$ of the volume distribution of the phosphors according to the invention for use in LEDs is usually between 50 nm and 30 µm, preferably between 1 µm and 20 µm. The particle size here is preferably determined by means of a Coulter counter measurement.

In still a further embodiment, the compounds according to the invention may be coated. Suitable for this purpose are all coating methods as are known to the person skilled in the art from the prior art and are used for phosphors. Suitable materials for the coating are, in particular, metal oxides and nitrides, in particular alkaline-earth metal oxides, such as $Al_2O_3$, and alkaline-earth metal nitrides, such as AlN, as well as $SiO_2$. The coating can be carried out here, for example, by fluidised-bed methods or by wet-chemical methods. Suitable coating methods are disclosed, for example, in JP 04-304290, WO 91/10715, WO 99/27033, US 2007/0298250, WO 2009/065480 and WO 2010/075908. The aim of the coating can on the one hand be higher stability of the phosphors, for example to air or moisture. However, the aim may also be improved coupling-in and -out of light through a suitable choice of the surface of the coating and the refractive indices of the coating material. As an alternative or in addition to an inorganic coating, the compounds may also be coated with organic materials, for example with siloxanes. This may have advantages with respect to the dispersibility in a resin during production of the LEDs.

The present invention again furthermore relates to the use of the compound according to the invention as phosphor or conversion phosphor, in particular for the partial or complete conversion of the near-UV or violet emission of a light-emitting diode into light having a longer wavelength.

The compounds according to the invention are also called phosphors below.

The present invention therefore furthermore relates to an emission-converting material comprising a compound according to the invention. The emission-converting material may consist of the compound according to the invention and would in this case be equivalent to the term "conversion phosphor" defined above. It may also be preferred for the emission-converting material according to the invention also to comprise further conversion phosphors besides the compound according to the invention. In this case, the emission-converting material according to the invention preferably comprises a mixture of at least two conversion phosphors, preferably a mixture of three conversion phosphors, where at least one thereof is a compound according to the invention. It is particularly preferred for the three conversion phosphors to be phosphors which emit light of wavelengths which are in the blue, green and red region of the spectrum. Depending on the exact composition, the inventive compounds can be particularly useful as green emitting compounds.

The inventive compounds show very good emission efficiencies. This is particularly the case for compounds, which contain a halogen ion X, in particular for compounds comprising fluorine.

The compounds according to the invention give rise to good LED qualities. The LED quality is described here via conventional parameters, such as, for example, the colour rendering index (CRI), the correlated colour temperature (CCT), lumen equivalent or absolute lumen, or the colour point in CIE x and y coordinates.

The colour rendering index (CRI) is a dimensionless lighting quantity, familiar to the person skilled in the art, which compares the colour reproduction faithfulness of an artificial light source with that of sunlight or filament light sources (the latter two have a CRI of 100).

The correlated colour temperature (CCT) is a lighting quantity, familiar to the person skilled in the art, with the unit kelvin. The higher the numerical value, the higher the blue content of the light and the colder the white light from an artificial radiation source appears to the observer. The CCT follows the concept of the black body radiator, whose colour temperature describes the so-called Planck curve in the CIE diagram.

The lumen equivalent is a lighting quantity, familiar to the person skilled in the art, with the unit lm/W which describes the magnitude of the photometric luminous flux in lumens of a light source at a certain radiometric radiation power with the unit watt. The higher the lumen equivalent, the more efficient a light source.

The lumen is a photometric lighting quantity, familiar to the person skilled in the art, which describes the luminous flux of a light source, which is a mea-sure of the total visible radiation emitted by a radiation source. The greater the luminous flux, the brighter the light source appears to the observer.

CIE x and CIE y stand for the coordinates in the standard CIE colour chart (here standard observer 1931), familiar to the person skilled in the art, by means of which the colour of a light source is described.

All the quantities mentioned above can be calculated from the emission spectra of the light source by methods familiar to the person skilled in the art.

The excitability of the phosphors according to the invention extends over a broad range, which extends from about 250 nm to 420 nm, preferably 350 nm to about 420 nm. The maximum of the excitation curve of the phosphors according to the invention is usually at about 350 to 370 nm, depending on the exact composition. As these phosphors still show a strong absorbance in the region of 400 to 420 nm, they are highly suitable to be used with a near-UV LED or violet LED.

The present invention furthermore relates to a light source which comprises at least one primary light source and at least one compound according to the invention. The emission maximum of the primary light source here is usually in the range 350 nm to 420 nm, preferably 370 nm to about 420 nm, where the primary radiation is converted partly or fully into longer-wave radiation by the phosphor according to the invention.

In a preferred embodiment of the light source according to the invention, the primary light source is a luminescent indium aluminium gallium nitride, in particular of the formula $In_iGa_jAl_kN$, where $0 \leq i$, $0 \leq j$, $0 \leq k$, and $i+j+k=1$.

Possible forms of light sources of this type are known to the person skilled in the art. These can be light-emitting LED chips of various structure.

Corresponding light sources according to the invention are also known as light-emitting diodes or LEDs.

In a further preferred embodiment of the light source according to the invention, the primary light source is a luminescent arrangement based on ZnO, TCO (transparent conducting oxide) or SiC.

In a further preferred embodiment of the light source according to the invention, the primary light source is a near-UV or violet laser.

In a further preferred embodiment of the light source according to the invention, the primary light source is a source which exhibits electroluminescence and/or photoluminescence. The primary light source may furthermore also be a plasma or discharge source.

The phosphors according to the invention can be employed individually or as a mixture with the following phosphors, which are familiar to the person skilled in the art. Depending on the exact emission colour of the inventive phosphors, they are particularly preferably employed in combination with one or more phosphors which emit in the blue, green or red spectral region. If the inventive phosphors emit in the blue region of the spectrum, they are preferably employed in combination with a phosphor emitting in the green region of the spectrum and a further phosphor emitting in the red region of the spectrum. If the inventive phosphors emit in the green region of the spectrum, they are preferably employed in combination with a phosphor emitting in the blue region of the spectrum and a further phosphor emitting in the red region of the spectrum. If the inventive phosphors emit in the red region of the spectrum, they are preferably employed in combination with a phosphor emitting in the blue region of the spectrum and a further phosphor emitting in the green region of the spectrum.

Corresponding phosphors which are in principle suitable for mixtures are, for example: $Ba_2SiO_4:Eu^{2+}$, $BaSi_2O_6:Pb^{2+}$, $Ba_xSr_{1-x}F_2:Eu^{2+}$, $BaSrMgSi_2O_7:Eu^{2+}$, $BaTiP_2O_7$, $(Ba,Ti)_2P_2O_7:Ti$, $Ba_3WO_6:U$, $BaY_2F_8:Er^{3+}$, $Yb^+$, $Be_2SiO_4:Mn^{2+}$, $Bi_4Ge_3O_{12}$, $CaAl_2O_4:Ce^{3+}$, $CaLa_4O_7:Ce^{3+}$, $CaAl_2O_4:Eu^{2+}$, $CaAl_2O_4:Mn^{2+}$, $CaAl_4O_7:Pb^{2+},Mn^{2+}$, $CaAl_2O_4:Tb^{3+}$, $Ca_3Al_2Si_3O_{12}:Ce^{3+}$, $Ca_3Al_2Si_3Oi_2:Ce^{3+}$, $Ca_3Al_2Si_3O_2:Eu^{2+}$, $Ca_2B_5O_9Br:Eu^{2+}$, $(Ca_{1-x}Sr_x)AlSi(N,O)_3:Eu$, $Ca_2B_5O_9Cl:Eu^{2+}$, $Ca_2B_6O_9Cl:Pb^{2+}$, $CaB_2O_4:Mn^{2+}$, $Ca_2B_2O_5:Mn^{2+}$, $CaB_2O_4:Pb^{2+}$, $CaB_2P_2O_9:Eu^{2+}$, $Ca_5B_2SiO_{10}:Eu^{3+}$, $Ca_{0.5}Ba_{0.5}Al_{12}O_{19}:Ce^{3+},Mn^{2+}$, $Ca_2Ba_3(PO_4)_3Cl:Eu^{2+}$, $CaCl_2:Eu^{2+},Mn^{2+}$ in $SiO_2$, $CaF_2:Ce^{3+}$, $CaF_2:Ce^{3+},Mn^{2+}$, $CaF_2:Ce^{3+},Tb^{3+}$, $CaF_2:Eu^{2+}$, $CaF_2:Mn^{2+}$, $CaGa_2O_4:Mn^{2+}$, $CaGa_4O_7:Mn^{2+}$, $CaGa_2S_4:Ce^{3+}$, $CaGa_2S_4:Eu^{2+}$, $CaGa_2S_4:Mn^{2+}$, $CaGa_2S_4:Pb^{2+}$, $CaGeO_3:Mn^{2+}$, $CaI_2:Eu^{2+}$, $CaLaBO_4:Eu^{3+}$, $CaLaB_3O_7:Ce^{3+},Mn^{2+}$, $Ca_2La_2BO_{6.5}:Pb^{2+}$, $Ca_2MgSi_2O_7$, $Ca_2MgSi_2O_7:Ce^{3+}$, $CaMgSi_2O_6:Eu^{2+}$, $Ca_3MgSi_2O_8:Eu^{2+}$, $Ca_2MgSi_2O_7:Eu^{2+}$, $CaMgSi_2O_6:Eu^{2+}$, $Mn^{2+}$, $Ca_2MgSi_2O_7:Eu^{2+},Mn^{2+}$, $CaMoO_4$, $CaMoO_4:Eu^{3+}$, $CaO:Bi^{3+}$, $CaO:Cd^{2+}$, $CaO:Cu^+$, $CaO:Eu^{3+}$, $CaO:Eu^{3+}$, $Na^+$, $CaO:Mn^{2+}$, $CaO:Pb^{2+}$, $CaO:Sb^{3+}$, $CaO:Sm^{3+}$, $CaO:Tb^{3+}$, $CaO:Zn^{2+}$, $Ca_2P_2O_7:Ce^{3+}$, $\alpha\text{-}Ca_3(PO_4)_2:Ce^{3+}$, $\beta\text{-}Ca_3(PO_4)_2:Ce^{3+}$, $Ca_5(PO_4)_3Cl:Eu^{2+}$, $Ca_5(PO_4)_3Cl:Mn^{2+}$, $Ca_5(PO_4)_3Cl:Sb^{3+}$, $Ca_5(PO_4)_3Cl:Sn^{2+}$, $\beta\text{-}Ca_3(PO_4)_2:Eu^{2+},Mn^{2+}$, $Ca_5(PO_4)_3F:Mn^{2+}$, $Ca_5(PO_4)_3F:Sb^{3+}$, $Ca_s(PO_4)_3F:Sn^{2+}$, $\alpha\text{-}Ca_3(PO_4)_2:Eu^{2+}$, $\beta\text{-}Ca_3(PO_4)_2:Eu^{2+}$, $Ca_2P_2O_7:Eu^{2+}$, $Ca_2P_2O_7:Eu^{2+}$, $Mn^{2+}$, $CaP_2O_6:Mn^{2+}$, $\alpha\text{-}Ca_3(PO_4)_2:Pb^{2+}$, $\alpha\text{-}Ca_3(PO_4)_2:Sn^{2+}$, $\beta\text{-}Ca_3(PO_4)_2:Sn^{2+}$, $\beta\text{-}Ca_2P_2O_7:Sn$, $Mn$, $CaS:Bi^{3+}$, $CaS:Bi^{3+}$, $Na$, $CaS:Ce^{3+}$, $CaS:Eu^{2+}$, $CaS:Cu^+$, $Na^+$, $CaS:La^{3+}$, $CaS:Mn^{2+}$, $CaSO_4:Bi$, $CaSO_4:Ce^{3+}$, $CaSO_4:Ce^{3+}$, $Mn^{2+}$, $CaSO_4:Eu^{2+}$, $CaSO_4:Eu^{2+}$, $Mn^{2+}$, $CaSO_4:Pb^{2+}$, $CaS:Pb^{2+}$, $CaS:Pb^{2+},Cl$, $CaS:Pb^{2+},Mn^{2+}$, $CaS:Pr^{3+}$, $Pb^{2+}$, $Cl$, $CaS:Sb^{3+}$, $CaS:Sb^{3+}$, $Na$, $CaS:Sm^{3+}$, $CaS:Sn^{2+}$, $CaS:Sn^{2+},F$, $CaS:Tb^{3+}$, $CaS:Tb^{3+},Cl$, $CaSiO_3:Ce^{3+}$, $Ca_3SiO_4Cl_2:Eu^{2+}$, $Ca_3SiO_4Cl_2:Pb^{2+}$, $CaSiO_3:Eu^{2+}$, $CaSiO_3:Mn^{2+},Pb$, $CaSiO_3:Pb^{2+}$, $CaSiO_3:Pb^{2+},Mn^{2+}$, $CaSiO_3:Ti^{4+}$, $CaSr_2(PO_4)_2:Bi^{3+}$, $(Ca,Sr,Ba)(Mg_2SiN_4):Eu$, $(Ca,Sr,Ba)(LiAl_3N_4):Eu$, $\beta\text{-}(Ca,Sr)_3(PO_4)_2:Sn^{2+}$ $Mn^{2+}$, $CaTi_{0.9}Al_{0.1}O_3:Bi^{3+}$, $CaTiO_3:Eu^{3+}$, $CaTiO_3:Pr^{3+}$, $Ca_5(VO_4)_3Cl$, $CaWO_4$, $CaWO_4:Pb^{2+}$, $CaWO_4:W$, $Ca_3WO_6:U$, $CaYAlO_4:Eu^{3+}$, $CaYBO_4:Bi^{3+}$, $CaYBO_4:Eu^{3+}$, $CaYB_{0.8}O_{3.7}:Eu^{3+}$, $CaY_2ZrO_6:Eu^{3+}$, $(Ca,Zn,Mg)_3(PO_4)_2:Sn$, $CeF_3$, $(Ce,Mg)BaAl_{11}O_{18}:Ce$, $(Ce,Mg)SrAl_{11}O_{18}:Ce$, $CeMgAl_{11}O_{19}:Ce:Tb$, $Cd_2B_6O_{11}:Mn^{2+}$, $CdS:Ag^+,Cr$, $CdS:In$, $CdS:In$, $Te$, $CdS:In$, $Te$, $CdS:Te$, $CdWO_4$, $CsF$, $CsI$, $CsI:Na^+$, $CsI:Tl$, $(ErCl_3)_{0.26}(BaCl_2)_{0.75}$, $GaN:Zn$, $Gd_3Ga_6O_{12}:Cr^{3+}$, $Gd_3Ga_5O_{12}:Cr$, $Ce$, $GdNba_4:Bi^{3+}$, $Gd_2O_2S:Eu^{3+}$, $Gd_2O_2Pr^{3+}$, $Gd_2O_2S:Pr$, $Ce$, $F$, $Gd_2O_2S:Tb^{3+}$, $Gd_2SiO_6:Ce^{3+}$, $KGa_{11}O_{17}:Mn^{2+}$, $K_2La_2Ti_3O_{10}:Eu$, $KMgF_3:Eu^{2+}$, $KMgF_3:Mn^{2+}$, $K_2(Si,Ti)F_6:Mn^{4+}$, $LaAl_3B_4O_{12}:Eu^{3+}$, $LaAlB_2O_6:Eu^{3+}$, $LaAlO_3:Eu^{3+}$, $LaAlO_3:Sm^{3+}$, $LaAsO_4:Eu^{3+}$, $LaBr_3:Ce^{3+}$, $LaBO_3:Eu^{3+}$, $(La, Ce, Tb)PO_4:Ce:Tb$, $LaCl_3:Ce^{3+}$, $La_2O_3:Bi^{3+}$, $LaOBr:Tb^{3+}$, $LaOBr:Tm^{3+}$, $LaOCl:Bi^{3+}$, $LaOCl:Eu^{3+}$, $LaOF:Eu^{3+}$, $La_2O_3:Eu^{3+}$, $La_2O_3:Pr^{3+}$, $La_2O_2S:Tb^{3+}$, $LaPO_4:Ce^{3+}$, $LaPO_4:Eu^{3+}$, $LaSiO_3Cl:Ce^{3+}$, $LaSiO_3Cl:Ce^{3+}$, $Tb^{3+}$, $LaVO_4:Eu^{3+}$, $La_2W_3O_{12}:Eu^{3+}$, $LiAlF_4:Mn^{2+}$, $LiAl_5O_8:Fe^{3+}$, $LiAlO_2:Fe^{3+}$, $LiAlO_2:Mn^{2+}$, $LiAl_5O_8:Mn^{2+}$, $Li_2CaP_2O_7:Ce^{3+},Mn^{2+}$, $LiCeBa_4Si_4O_{14}:Mn^{2+}$, $LiCeSrBa_3Si_4O_{14}:Mn^{2+}$, $LiInO_2:Eu^{3+}$, $LiInO_2:Sm^{3+}$, $LiLaO_2:Eu^{3+}$, $LuAlO_3:Ce^{3+}$, $(Lu,Gd)_2SiO_5:Ce^{3+}$, $Lu_2SiO_5:Ce^{3+}$, $Lu_2Si_2O_7:Ce^{3+}$, $LuTaO_4:Nb^{5+}$, $Lu_{1-x}Y_xAlO_3:Ce^{3+}$, $MgAl_2O_4:Mn^{2+}$, $MgSrAl_{10}O_{17}:Ce$, $MgB_2O_4:Mn^{2+}$, $MgBa_2(PO_4)_2:Sn^{2+}$, $MgBaP_2O_7:Eu^{2+}$, $MgBaP_2O_7:Eu^{2+},Mn^{2+}$, $MgBa_3Si_2O_8:Eu^{2+}$, $MgBa(SO_4)_2:Eu^{2+}$, $Mg_3Ca_3(PO_4)_4:Eu^{2+}$, $MgCaP_2O_7:Mn^{2+}$, $Mg_2Ca(SO_4)_3:Eu^{2+}$, $Mg_2Ca(SO_4)_3:Eu^{2+},Mn^2$, $MgCeAl_nO_{19}:Tb^{3+}$, $Mg_4(F)GeO_6:Mn^{2+}$, $Mg_4(F)(Ge,Sn)O_6:Mn^{2+}$, $MgF_2:Mn^{2+}$, $MgGa_2O_4:Mn^{2+}$, $Mg_8Ge_2O_{11}F_2:Mn^{4+}$, $MgS:Eu^{2+}$, $MgSiO_3:Mn^{2+}$, $Mg_2SiO_4:Mn^{2+}$, $Mg_3SiO_3F_4:Ti^{4+}$, $MgSO_4:Eu^{2+}$, $MgSO_4:Pb^{2+}$, $MgSrBa_2Si_2O_7:Eu^{2+}$, $MgSrP_2O_7:Eu^{2+}$, $MgSr_5(PO_4)_4:Sn^{2+}$, $MgSr_3Si_2O_8:Eu^{2+},Mn^{2+}$, $Mg_2Sr(SO_4)_3:Eu^{2+}$, $Mg_2TiO_4:Mn^{4+}$, $MgWO_4$, $MgYBO_4:Eu^{3+}$, $Na_3Ce(PO_4)_2:Tb^{3+}$, $Na_{1.23}K_{0.42}Eu_{0.12}TiSi_4O_{11}:Eu^{3+}$, $Na_{1.23}K_{0.42}Eu_{0.12}TiSi_5O_{13}.xH_2O:Eu^{3+}$, $Na_{1.29}K_{0.46}Er_{0.08}TiSi_4O_{11}:Eu^{3+}$, $Na_2Mg_3Al_2Si_2O_{10}:Tb$, $Na(Mg_2, Mn_x)LiSi_4O_{10}F_2:Mn$, $NaYF_4:Er^{3+}$, $Yb^{3+}$, $NaYO_2:Eu^{3+}$, $P46(70\%)+P47(30\%)$, $SrAl_{12}O_{19}:Ce^{3+}$, $Mn^{2+}$, $SrAl_2O_4:Eu^{2+}$, $SrAl_4O_7:Eu^{3+}$, $SrAl_{12}O_{19}:Eu^{2+}$, $SrAl_2S_4:Eu^{2+}$, $Sr_2B_5O_9Cl:Eu^{2+}$, $SrB_4O_7:Eu^{2+}(F,Cl,Br)$, $SrB_4O_7:Pb^{2+}$, $SrB_4O_7:Pb^{2+}$, $Mn^{2+}$, $SrB_8O_{13}:Sm^{2+}$, $Sr_xBa_yCl_zAl_2O_{4-z/2}:Mn^{2+}$, $Ce^{3+}$, $SrBaSiO_4:Eu^{2+}$, $Sr(Cl,Br,I)_2:Eu^{2+}$ in $SiO_2$, $SrCl_2:Eu^{2+}$ in $SiO_2$, $Sr_5Cl(PO_4)_3:Eu$, $Sr_wF_xB_4O_{6.5}:Eu^{2+}$, $Sr_wF_xB_yO_z:Eu^{2+}$, $Sm^{2+}$, $SrF_2:Eu^{2+}$, $SrGa_{12}O_{19}:Mn^{2+}$, $SrGa_2S_4:Ce^{3+}$, $SrGa_2S_4:Eu^{2+}$, $SrGa_2S_4:Pb^{2+}$, $SrIn_2O_4:Pr^{3+}$, $Al^{3+}$, $(Sr,Mg)_3(PO_4)_2:Sn$, $SrMgSi_2O_6:Eu^{2+}$, $Sr_2MgSi_2O_7:Eu^{2+}$, $Sr_3MgSi_2O_8:Eu^{2+}$, $SrMoO_4:U$, $SrO.3B_2O_3:Eu^{2+},Cl$, $\beta\text{-}SrO.3B_2O_3:Pb^{2+}$, $\beta\text{-}SiAlON$, $\beta\text{-}SrO.3B_2O_3:Pb^{2+},Mn^{2+}$, $\alpha\text{-}SrO.3B_2O_3:Sm^{2+}$, $Sr_6P_5BO_{20}:Eu$, $Sr_5(PO_4)_3Cl:Eu^{2+}$, $Sr_5(PO_4)_3Cl:Eu^{2+},Pr^{3+}$, $Sr_5(PO_4)_3Cl:Mn^{2+}$, $Sr_5(PO_4)_3Cl:Sb^{3+}$, $Sr_2P_2O_7:Eu^{2+}$, $\beta\text{-}Sr_3(PO_4)_2:Eu^{2+}$, $Sr_5(PO_4)_3F:Mn^{2+}$, $Sr_5(PO_4)_3F:Sb^{3+}$, $Sr_5(PO_4)_3F:Sb^{3+},Mn^{2+}$, $Sr_5(PO_4)_3F:Sn^{2+}$, $Sr_2P_2O_7:Sn^{2+}$, $\beta\text{-}Sr_3(PO_4)_2:Sn^{2+}$, $\beta\text{-}Sr_3(PO_4)_2:Sn^{2+},Mn^{2+}$ (Al), $SrS:Ce^{3+}$, $SrS:Eu^{2+}$, $SrS:Mn^{2+}$, $SrS:Cu^+,Na$, $SrSO_4:Bi$, $SrSO_4:Ce^{3+}$, $SrSO_4:Eu^{2+}$, $SrSO_4:Eu^{2+},Mn^{2+}$, $Sr_5Si_4O_{10}Cl_6:Eu^{2+}$, $Sr_2SiO_4:Eu^{2+}$, $SrTiO_3:Pr^{3+}$, $SrTiO_3:Pr^{3+},Al^{3+}$, $SrY_2O_3:Eu^{3+}$, $ThO_2:Eu^{3+}$, $ThO_2:Pr^{3+}$, $ThO_2:Tb^{3+}$, $YAl_3B_4O_{12}:Bi^{3+}$, $YAl_3B_4O_{12}:Ce^{3+}$, $YAl_3B_4O_{12}:Ce^{3+},Mn$, $YAl_3B_4O_{12}:Ce^{3+}$, $Tb^{3+}$, $YAl_3B_4O_{12}:Eu^{3+}$, $YAl_3B_4O_{12}:Eu^{3+},Cr^{3+}$, $YAl_3B_4O_{12}:Th^{4+},Ce^{3+}$, $Mn^{2+}$, $YAlO_3:Ce^{3+}$, $Y_3Al_5O_{12}:Ce^{3+}$, $(Lu,Y,Gd,Tb)_3(Al,Ga)_5(O,N)_{12}$, $Y_3Al_5O_{12}:Cr^{3+}$, $YAlO_3:Eu^{3+}$, $Y_3Al_5O_{12}:Eu^{3r}$, $Y_4Al_2O_9:Eu^{3+}$, $Y_3Al_5O_{12}:Mn^{4+}$, $YAlO_3:Sm^{3+}$, $YAlO_3:Tb^{3+}$, $Y_3Al_5O_{12}:Tb^{3+}$, $YA_sO_4:Eu^{3+}$, $YBO_3:Ce^{3+}$, $YBO_3:Eu^{3+}$, $YF_3:Er^{3+}$, $Yb^{3+}$, $YF_3:Mn^{2+}$, $YF_3:Mn^{2+}$, $Th^{4+}$, $YF_3:Tm^{3+}$, $Yb^{3+}$, $(Y,Gd)BO_3:Eu$, $(Y,Gd)BO_3:Tb$, $(Y,Gd)_2O_3:Eu^{3+}$, $Y_{1.34}Gd_{0.60}O_3(Eu,Pr)$, $Y_2O_3:Bi^{3+}$, $YOBrEu^{3+}$, $Y_2O_3:Ce$, $Y_2O_3:Er^{3+}$, $Y_2O_3:Eu^{3+}+(YOE)$, $Y_2O_3:Ce^{3+}$, $Tb^{3+}$, $YOCl:Ce^{3+}$, $YOCl:Eu^{3+}$, $YOF:Eu^{3+}$, $YOF:Tb^{3+}$, $Y_2O_3:Ho^{3+}$, $Y_2O_2S:Eu^{3+}$, $Y_2O_2S:Pr^{3+}$, $Y_2O_2S:$ $Tb^{3+}$, $Y_2O_3:Tb^{3+}$, $YPO_4:Ce^{3+}$, $YPO_4:Ce^{3+}$, $Tb^{3+}$, $YPO_4$: $Eu^{3+}$, $YPO_4:Mn^{2+}$, $Th^{4+}$, $YPO_4:V^{5+}$, $Y(P,V)O_4:Eu$, $Y_2SiO_5$: $Ce^{3+}$, $YTaO_4$, $YTaO_4:Nb^{5+}$, $YVO_4:Dy^{3+}$, $YVO_4:Eu^{3+}$, $ZnAl_2O_4:Mn^{2+}$, $ZnB_2O_4:Mn^{2+}$, $ZnBa_2S_3:Mn^{2+}$, $(Zn,Be)_2$ $SiO_4:Mn^{2+}$, $Zn_{0.4}Cd_{0.6}S:Ag$, $Zn_{0.6}Cd_{0.4}S:Ag$, $(Zn,Cd)S:Ag$, Cl, $(Zn,Cd)S:Cu$, $ZnF_2:Mn^{2+}$, $ZnGa_2O_4$, $ZnGa_2O_4:Mn^{2+}$, $ZnGa_2S_4:Mn^{2+}$, $Zn_2GeO_4:Mn^{2+}$, $(Zn,Mg)F_2:Mn^{2+}$, $ZnMg_2(PO_4)_2:Mn^{2+}$, $(Zn,Mg)_3(PO_4)_2:Mn^{2+}$, $ZnO:Al^{3+},Ga^{3+}$, $ZnO:Bi^{3+}$, $ZnO:Ga^{3+}$, $ZnO:Ga$, $ZnO-CdO:Ga$, $ZnO:S$, $ZnO:Se$, $ZnO:Zn$, $ZnS:Ag^+$, $Cl^-$, $ZnS:Ag,Cu,Cl$, $ZnS:Ag,Ni$, $ZnS:Au,In$, $ZnS-CdS$ (25-75), $ZnS-CdS$ (50-50), $ZnS-CdS$ (75-25), $ZnS-CdS:Ag,Br,Ni$, $ZnS-CdS:Ag^+,Cl$, $ZnS-CdS:Cu,Br$, $ZnS-CdS:Cu,I$, $ZnS:Cl^-$, $ZnS:Eu^{2+}$, $ZnS:Cu$, $ZnS:Cu^+,Al^{3+},ZnS:Cu^+,Cl^-$, $ZnS:Cu,Sn$, $ZnS:Eu^{2+}$, $ZnS:Mn^{2+}$, $ZnS:Mn,Cu$, $ZnS:Mn^{2+},Te^{2+}$, $ZnS:P$, $ZnS:Pb^{3-},Cl^-$, $ZnS:Pb^{2+},ZnS:Pb^{2+}$, $Cl^-$, $ZnS:Pb,Cu$, $Zn_3(PO_4)_2:Mn^{2+}$, $Zn_2SiO_4:Mn^{2+}$, $Zn_2SiO_4:Mn^{2+},As^{5+}$, $Zn_2SiO_4:Mn,Sb_2O_2$, $Zn_2SiO_4:Mn^{2+},P$, $Zn_2SiO_4:Ti^{4+}$, $ZnS:Sn^{2+}$, $ZnS:Sn,Ag$, $ZnS:Sn^{2+},Li^+$, $ZnS:Te,Mn$, $ZnS-ZnTe:Mn^{2+}$, $ZnSe:Cu^+,Cl$ and $ZnWO_4$.

The phosphors or phosphor combinations according to the invention can either be dispersed in a resin (for example epoxy or silicone resin) or, in the case of suitable size ratios, arranged directly on the primary light source or alternatively arranged remote therefrom, depending on the application (the latter arrangement also includes "remote phosphor technology"). The advantages of remote phosphor technology are known to the person skilled in the art and are revealed, for example, by the following publication: Japanese J. of Appl. Phys. Vol. 44, No. 21 (2005). L649-L651.

In a further embodiment, it is preferred for the optical coupling between the phosphor and the primary light source to be achieved by a light-conducting arrangement. This makes it possible for the primary light source to be installed at a central location and to be optically coupled to the phosphor by means of light-conducting devices, such as, for example, optical fibres. In this way, it is possible to achieve lamps adapted to the lighting wishes which merely consist of one or different phosphors, which can be arranged to form a light screen, and an optical waveguide, which is coupled to the primary light source. In this way, it is possible to place a strong primary light source at a location which is favourable for electrical installation and to install lamps comprising phosphors which are coupled to the optical waveguides at any desired locations without further electrical cabling, but instead only by laying optical waveguides.

The invention furthermore relates to a lighting unit, in particular for the backlighting of display devices, characterised in that it comprises at least one light source according to the invention, and to a display device, in particular liquid-crystal display device (LC display), with backlighting, characterised in that it comprises at least one lighting unit according to the invention.

For use in LEDs, the phosphors can also be converted into any desired outer shapes, such as spherical particles, platelets and structured materials and ceramics. These shapes are in accordance with the invention summarised under the term "shaped bodies". The shaped body is preferably a "phosphor body". The present invention thus furthermore relates to a shaped body comprising the phosphors according to the invention. The production and use of corresponding shaped bodies are familiar to the person skilled in the art from numerous publications.

It is also advantageous to use the phosphors according to the invention in the form of translucent ceramics, since the optical path length, i.e. the thickness of the ceramic layer, in ceramic luminescence conversion screens can be increased owing to the reduced scattering compared with a powder layer. The present invention therefore furthermore relates to a ceramic comprising at least one compound according to the invention. The ceramic may then consist only of the compound according to the invention. However, it may also comprise matrix materials and/or further phosphors. Suitable matrix materials are, for example, $SiO_2$, $Y_2O_3$ or $Al_2O_3$.

The compounds according to the invention have the following advantageous properties:

1) The compounds according to the invention have a high photoluminescence quantum efficiency. This is even more the case for compounds which comprise a halogen anion X, in particular fluorine.
2) The compounds according to the invention show little or no absorption in the blue region of the spectrum and are therefore highly suitable for use in fpc-LEDs (fully-phosphor-converted LEDs) using a near-UV or violet LED as the primary light source.
3) The compounds according to the invention exhibit, depending on the exact composition, green emission. It is particularly rare to find green emitting phosphors, which do essentially not absorb in the blue region of the spectrum.
4) The compounds according to the invention have high chemical stability.

All variants of the invention described here can be combined with one another so long as the respective embodiments are not mutually exclusive. In particular, it is an obvious operation, on the basis of the teaching of this specification, as part of routine optimisation, precisely to combine various variants described here in order to obtain a specific particularly preferred embodiment. The following examples are intended to illustrate the present invention and show, in particular, the result of such illustrative combinations of the invention variants described. However, they should in no way be regarded as limiting, but instead are intended to stimulate generalisation. All compounds or components which are used in the preparations are either known and commercially available or can be synthesised by known methods. The temperatures indicated in the examples are always in ° C. It furthermore goes without saying that, both in the description and also in the examples, the amounts of the components added in the compositions always add up to a total of 100%. Percent data should always be regarded in the given connection.

EXAMPLES

The phase formation of the samples was in each case checked by means of X-ray diffractometry. For this purpose, a Rigaku Miniflex II X-ray diffrac-tometer with Bragg-Brentano geometry was used. The radiation source used was an X-ray tube with Cu-Kα radiation (λ=0.15418 nm). The tube was operated at a current strength of 15 mA and a voltage of 30 kV. The measurement was carried out in an angle range of 10–80° at 10°·min⁻¹.

Reflection spectra were determined using an Edinburgh Instruments Ltd. fluorescence spectrometer. For this purpose, the samples were placed and measured in a $BaSO_4$-coated integrating sphere. Reflection spectra were recorded in a range from 250-800 nm. The white standard used was $BaSO_4$ (Alfa Aesar 99.998%). A 450 W Xe lamp was used as excitation source.

The excitation spectra and emission spectra were recorded using an Edinburgh Instruments Ltd. fluorescence spectrometer fitted with mirror optics for powder samples. The excitation source used was a 450 W Xe lamp.

Synthesis of Inventive Compounds

Example 1: Synthesis of $Ba_{0.63}Eu_{0.12}Al_{11}O_{17.25} \cdot F_{0.0015}$ 2.486 g $BaCO_3$
0.422 g $Eu_2O_3$
11.21 g $Al_2O_3$
0.131 g $BaF_2$ The starting materials are mixed in a mechanical mortar for 10 minutes and fired at 1550° C. for 5 h in an $H_2:N_2$ (5:95) atmosphere with an intermediate dwell step at 1350° C. for 3 h in 100% $N_2$ atmosphere. After firing, the material is ground into a fine powder, washed in water, dried and sieved using a 50 μm nylon sieve to narrow the particle size range.

Example 2: Synthesis of $Ba_{0.63}Eu_{0.12}Al_{10.8}Sc_{0.2}O_{17.25} \cdot F_{0.0015}$ This synthesis is performed as described in example 1 using the following starting materials:
2.486 g $BaCO_3$
0.422 g $Eu_2O_3$
11.012 g $Al_2O_3$
0.276 g $Sc_2O_3$
0.131 g $BaF_2$ Example 3: Synthesis of $Ba_{0.63}Eu_{0.12}Al_{10.5}Sc_{0.5}O_{17.25} \cdot F_{0.0015}$ This synthesis is performed as described in example 1 using the following starting materials:
2.486 g $BaCO_3$
0.422 g $Eu_2O_3$
10.706 g $Al_2O_3$
0.690 g $Sc_2O_3$
0.131 g $BaF_2$ Example 4: Synthesis of $Ba_{0.63}Eu_{0.12}Al_{10.8}Si_{0.15}O_{17.025}N_{0.15} \cdot F_{0.0015}$ This synthesis is performed as described in example 1 using the following starting materials:
2.486 g $BaCO_3$
0.422 g $Eu_2O_3$
10.859 g $Al_2O_3$
0.180 g $SiO_2$
0.123 g AlN
0.131 g $BaF_2$ The synthesis processes given above are just the typical synthesis examples. It is possible by the same synthesis procedure to produce other inventive compounds. It is also possible to use different gases and temperatures in the manufacturing process of the materials.

The materials in the following Table 1 are produced in analogy to the compounds described in examples 1 to 4 using stoichiometric amounts of the corresponding starting materials and firing at temperatures between 1450 and 1550° C. It is possible for the samples prepared at 1450° C. that higher quantum efficiencies are obtained when a higher synthesis temperature is used. Unless otherwise stated, the starting materials were fired at 1550° C. following the procedure of Example 1. Table 1 furthermore shows the spectroscopic results (emission wavelengths as well as quantum efficiencies) of the samples.

TABLE 1

Compounds synthesized with spectroscopic data (emission wavelength and quantum efficiency)

| Ex. | Composition | Emission Peak [nm] | iQE [%] |
|---|---|---|---|
| 5 | $Ba_{0.69}Sr_{0.0225}Eu_{0.0375}Al_{11}O_{17.25} \cdot F_{0.0015}$ | 515 | 86 |
| 6 | $Ba_{0.69}Ca_{0.0225}Eu_{0.0375}Al_{11}O_{17.25} \cdot F_{0.0015}$ | 511 | 88 |
| 7 | $Ba_{0.7125}Eu_{0.0375}Al_{10.7753}Ga_{0.225}O_{17.25} \cdot F_{0.0015}$ | 518 | 89 |
| 8 | $Ba_{0.7125}Eu_{0.0375}Al_{10.6253}In_{0.375}O_{17.25} \cdot F_{0.0015}$ | 516 | 84 |
| 9 | $Ba_{0.735}Eu_{0.015}Al_{11}O_{17.25} \cdot F_{0.0015}$ | 507 | 78 |
| 10 | $Ba_{0.675}Eu_{0.075}Al_{11}O_{17.25} \cdot F_{0.0015}$ | 518 | 87 |
| 11 | $Ba_{0.705}Eu_{0.0375}Al_{11}O_{17.25} \cdot F_{0.0015}$ | 518 | 88 |
| 12 | $Ba_{0.63}Eu_{0.12}Al_{11}O_{17.25} \cdot F_{0.0015}$ | 519 | 95 |
| 13 | $Ba_{0.63}Eu_{0.12}Al_{10.8}Si_{0.15}O_{17.025}N_{0.15} \cdot F_{0.0015}$ | 521 | 87 |
| 14 | $Ba_{0.63}Eu_{0.12}Al_{10.8}Sc_{0.2}O_{17.25} \cdot F_{0.0015}$ | 517 | 90 |
| 15 | $Ba_{0.6525}Eu_{0.075}La_{0.0225}Al_{11}O_{17.2613} \cdot F_{0.0015}$ | 515 | 84 |
| 16 | $Ba_{0.6525}Eu_{0.075}La_{0.0225}Al_{11}O_{17.2605} \cdot F_{0.0015}$ | 516 | 83 |
| 17 | $Ba_{0.69}Eu_{0.06}Al_{10.9}Sc_{0.1}O_{17.25} \cdot F_{0.0015}$ | 515 | 90 |
| 18 | $Ba_{0.66}Eu_{0.09}Al_{10.9}Sc_{0.1}O_{17.25} \cdot F_{0.0015}$ | 516 | 84 |
| 19 | $Ba_{0.63}Eu_{0.12}Al_{10.9}Sc_{0.1}O_{17.25} \cdot F_{0.0015}$ | 518 | 70 |
| 20 | $Ba_{0.6}Eu_{0.15}Al_{10.9}Sc_{0.1}O_{17.25} \cdot F_{0.0015}$ | 518 | 64 |
| 21 | $Ba_{0.57}Eu_{0.18}Al_{10.9}Sc_{0.1}O_{17.25} \cdot F_{0.0015}$ | 515 | 58 |
| 22 | $Ba_{0.54}Eu_{0.21}Al_{10.9}Sc_{0.1}O_{17.25} \cdot F_{0.0015}$ | 515 | 56 |
| 23 | $Ba_{0.69}Eu_{0.06}Al_{10.8}Sc_{0.2}O_{17.25} \cdot F_{0.0015}$ | 515 | 52 |
| 24 | $Ba_{0.66}Eu_{0.09}Al_{10.8}Sc_{0.2}O_{17.25} \cdot F_{0.0015}$ | 515 | 55 |
| 25 | $Ba_{0.63}Eu_{0.12}Al_{10.8}Sc_{0.2}O_{17.25} \cdot F_{0.0015}$ (prepared at 1450° C.) | 519 | 62 |
| 26 | $Ba_{0.63}Eu_{0.12}Al_{10.8}Sc_{0.2}O_{17.25} \cdot F_{0.0015}$ (prepared at 1550° C.) | 519 | 90 |
| 27 | $Ba_{0.6}Eu_{0.15}Al_{10.8}Sc_{0.2}O_{17.25} \cdot F_{0.0015}$ | 518 | 60 |
| 28 | $Ba_{0.57}Eu_{0.18}Al_{10.8}Sc_{0.2}O_{17.25} \cdot F_{0.0015}$ | 515 | 56 |
| 29 | $Ba_{0.54}Eu_{0.21}Al_{10.8}Sc_{0.2}O_{17.25} \cdot F_{0.0015}$ | 515 | 55 |
| 30 | $Ba_{0.63}Eu_{0.12}Al_{10.5}Sc_{0.5}O_{17.25} \cdot F_{0.0015}$ | 516 | 82 |
| 31 | $Ba_{0.57375}Eu_{0.12}K_{0.028125}Al_{11}O_{17.25} \cdot F_{0.0015}$ | 516 | 93 |

The compositions of the starting materials used in Examples 7, 8, 15 and 31 which involve at least one of the elements Ga, In, La and K are as follows:

Example 7: Synthesis of $Ba_{0.7125}Eu_{0.0375}Al_{10.7753}Ga_{0.225}O_{17.25} \cdot F_{0.0015}$ This synthesis is performed as described in example 1 using the following starting materials:
3.750 g $BaCO_3$
0.175 g $Eu_2O_3$
14.165 g $Al_2O_3$
0.565 g $Ga_2O_3$
0.055 g $AlF_3 \times 3H_2O$ Example 8: Synthesis of $Ba_{0.7125}Eu_{0.0375}Al_{10.6253}In_{0.375}O_{17.25} \cdot F_{0.0015}$ This synthesis is performed as described in example 1 using the following starting materials:
3.750 g $BaCO_3$
0.175 g $Eu_2O_3$
14.480 g $Al_2O_3$
1.390 g $In_2O_3$
0.055 g $AlF_3 \times 3H_2O$ Example 15: Synthesis of $Ba_{0.6525}Eu_{0.075}La_{0.0225}Al_{11}O_{17.2613} \cdot F_{0.0015}$ This synthesis is performed as described in example 1 using the following starting materials:

3.435 g $BaCO_3$
0.350 g $Eu_2O_3$
14.990 g $Al_2O_3$
0.100 g $La_2O_3$
0.140 g $BaF_2$

Example 31: Synthesis of $Ba_{0.57375}Eu_{0.12}K_{0.028125}Al_{11}O_{17.25} \cdot F_{0.0015}$ This synthesis is performed as described in example 1 using the following starting materials:
3.020 g $BaCO_3$
0.565 g $Eu_2O_3$
14.990 g $Al_2O_3$
0.075 g $K_2CO_3 \times 0.5H_2O$
0.175 g $BaF_2$ The fluorine content of the phosphors shown in Table 1 was determined independently with two different analytical techniques, wherein the first technique is semi-quantitative Time of Flight Secondary Ion Mass Spectrometry (TOF-SIMS) and the second technique is quantitative X-Ray Photoelectron Spectroscopy (XPS). Both techniques are well known to a person skilled in the art. TOF-SIMS is a technique used to analyze the composition of solid surfaces and thin films by sputtering the surface of a sample with a focused primary ion beam and collecting and analyzing ejected secondary ions. The mass/charge ratios of these secondary ions are measured with a mass spectrometer to determine the elemental, isotopic, or molecular composition of the surface to a depth of 1 to 2 nm. Due to the large variation in ionization probabilities among different materials, SIMS is generally considered to be a qualitative technique, although quantitation is possible with the use of standards. XPS is a surface-sensitive quantitative spectroscopic technique that measures the elemental composition at the parts per thousand range, empirical formula, chemical state and electronic state of the elements that exist within a material. XPS spectra are obtained by irradiating a material with a beam of X-rays while simultaneously measuring the kinetic energy and number of electrons that escape from the top 0 to 10 nm of the material being analyzed.

TOF-SIMS:

The surface of the samples was exposed to a pulsed ion beam which ejects secondary ions from the surface. The mass and chemical element of the ejected secondary ions was determined from their specific time of flight (TOF).

Instrument: IONTOF, TOF-SIMS-300
Analysis ion: $Bi_x^+$, 25 keV
Sputter ion: $Cs^+$, 1 keV Depth profiles were also measured. The erosion of the surface was carried out by sputtering with cesium ions of energy 1 keV.

XPS:

The surface of the samples was irradiated with monochromatic X-rays having a defined energy so that photoelectrons were released from all atoms being located in a near-surface region. The kinetic energy of the photoelectrons was measured by a hemispherical energy analyzer. By converting such kinetic energies into binding energies, the corresponding chemical elements can be determined from which the photoelectrons were released.

All XPS measurements were carried out with a PHI Quantera SXM instrument using the following parameters:

Excitation: monochromatic Al-Kα radiation (1486.6 eV/15 kV)
Recording angle: 45°
Pass energy: 280 eV (overview)/55+140 eV (detail)
140 eV (depth profile)
Chamber pressure: ca. $3 \cdot 10^{-6}$ Pa
Measurement area: 200 μm
Sputter ion: Ar
Erosion rate: 1 keV (ca. 10 nm/min)
Sputter area: 1 mm×1 mm All samples were first pressed onto an indium carrier film, then mounted on the sample holder and introduced into the ultra-high-vacuum chamber of the XPS device. At first, overview spectra were recorded from the powder's surface to determine the elements which are present. Then, energetically higher-resolved spectra were recorded from the detected elements. In addition, depth profiles of the elements were recorded.

A fluorine content of $F_{0.0015}$ as indicated for the Examples in Table 1 was determined using the above-mentioned TOF-SIMS and XPS methods.

Table 1 shows that variation of the composition has a relatively strong influence on the position of the emission peak. Furthermore, the efficiency changes with changing composition. This is analogous for the $Eu^{2+}$ concentration series, presented in the table for two materials with different $Sc^{3+}$ co-doping in place of $Al^{3+}$. The shift of the peak position with increasing divalent europium content in the host lattice first follows an expected track (red-shift), while at higher doping levels there is unexpected blue-shift. Furthermore, there is a difference in emission efficiency depending on the synthesis temperature, as can be seen from examples 25 and 26.

The β-alumina structure of all compounds was confirmed by X-ray diffraction. Examples of the XRD results are shown in FIG. 1 to 3.

The emission spectra of some selected compounds are shown in FIGS. 4 and 5. The excitation spectra of some selected compounds are shown in FIG. 6. The excitation spectra remain essentially the same with respect to their spectral position, although the relative intensity varies for different compositions. The emission spectra show that varying the composition of the material influences the peak maximum position.

Example 32: Spectroscopic Comparison of a Sample According to the Prior Art with the Inventive Material A comparative sample according to the prior art ($Ba_{0.63}Eu_{0.12}Al_{11}O_{17.25}$), which does not contain any fluorine, was prepared as described in the literature (A. L. N. Stevels, J. of Luminescence 17 (1978), 121-133). This sample shows blue and green luminescence with a major contribution of the blue part, while the inventive material ($Ba_{0.63}Eu_{10.12}Al_{11}O_{17.25} \cdot F_{0.0015}$ according to example 1), containing fluorine, under the same conditions shows mostly green emission with only a minor contribution of the blue light. The results show that the fluorine incorporation enhances the green emission even under, unfavorable, UV excitation. The emission spectra are shown in FIG. 7.

Furthermore, the fluorine inclusion into the host lattice is supported by the fact that the theoretical limit to the green luminescence in the discussed material of about QE=40% (based on literature data A. L. N. Stevels, J. of Luminescence 17 (1978), 121-133) is confirmed in the present case for the sample according to the prior art (QE≈40-50%). In contrast, the inventive material shows a much improved efficiency with QE typically above 80% and in some compositional variants with a QE≈95%, in all the cases under a 410 nm violet excitation.

LED Examples

General Instructions for Manufacturing and Measurement of Phosphor-Converted-LEDs (Pc-LEDs)

A mass of $m_{p,n}$ (where the index n denotes the number of the phosphor component of the phosphor blend related to the particular LED-example) of the phosphor component mentioned in the particular LED-example is weighed together with the other phosphor components (masses of $m_{p,n}$, n>1) and subsequently mixed (e.g. by use of a planetary centrifugal mixer). To the phosphor blend obtained by the process mentioned before, a mass of $m_{Silicone}$ of an optical transparent silicone is added and subsequently homogenously mixed by means of a planetary centrifugal mixer, in order to obtain a phosphor concentration of $c_p$ (in % by mass) in the whole mass of the silicone-phosphor slurry. The slurry is then dispensed onto a blue or near-UV or UV- or violet-light-emitting LED-die by means of an automated dispensing equipment and cured under elevated temperatures, depending on the properties of the used transparent silicone. The LED-dies used in the examples mentioned below emit visible violet light at a wavelength of 407 nm or 411 nm, respectively, and are driven at an operating current of 350 mA. The lighting-technology-related parameters are obtained by means of a spectrometer from Instrument Systems, type CAS 140 CT combined with an integration sphere ISP 250. The characterization of the pc-LED is performed by measurement of the wavelength-dependent spectral power density. The spectrum of the emitted light from the pc-LED is then used for the calculation of colour coordinates x and y (CIE 1931—2-degree observer), photometric fluxes $\Phi_v$, Correlated Colour Temperature (CCT) and the Color Rendering Index (CRI).

Example 33: LEDs Using Phosphor According to the Invention

The inventive LEDs are manufactured as described above. The phosphors used in the following examples are summarised in Table 2. The results obtained from the pc-LED examples are summarised in Table 3.

TABLE 2

Phosphors used in the pc-LED examples

| Phosphor component no. | Phosphor material |
| --- | --- |
| 1 (blue) | $(Ba, Sr, Ca)_3MgSi_2O_8: Eu^{2+}$ |
| 2 (green), acc. to the present invention | $Ba_{0.63}Eu_{0.12}Al_{11}O_{17.25} \cdot F_{0.0015}$ |
| 3 (red) | CASN: $Eu^{2+}$ |

TABLE 3

Results of pc-LED examples

| Parameter | LED example a | LED example b |
| --- | --- | --- |
| Peak-wavelength of LED dye | 407 | 410 |
| $m_{p,1}$/g | 0.53 | 0.53 |
| $m_{p,2}$/g | 5.86 | 5.86 |
| $m_{p,3}$/g | 0.11 | 0.11 |
| $M_{silicone}$/g | 3.5 | 3.5 |

TABLE 3-continued

Results of pc-LED examples

| Parameter | LED example a | LED example b |
| --- | --- | --- |
| $c_p$/wt. % | 65 | 65 |
| CIE x | 0.418 | 0.419 |
| CIE y | 0.399 | 0.397 |
| CCT/K | 3296 | 3277 |
| CRI | 91 | 91 |
| photometric flux/lm | 43 | 43 |

As can be easily seen, both LEDs give the same results with respect to colour, etc. These results are therefore independent of the exact emission colour of the LED chip.

BRIEF DESCRIPTION OF THE FIGURES

FIG. 8: Spectrum of the LED of example 33a.

Figure 1:
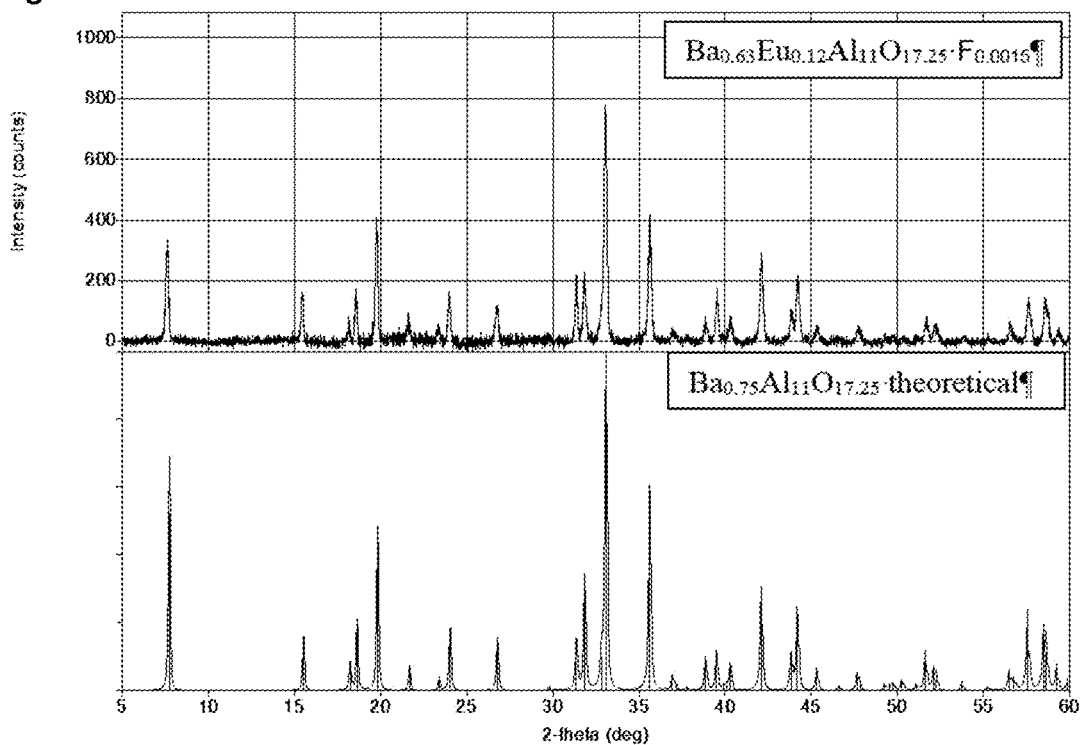
FIG. 1: XRD pattern of $Ba_{0.63}Eu_{0.12}Al_{11}O_{17.25} \cdot F_{0.0015}$ (example 1) showing the phase pure β-alumina structure.
Figure 2:
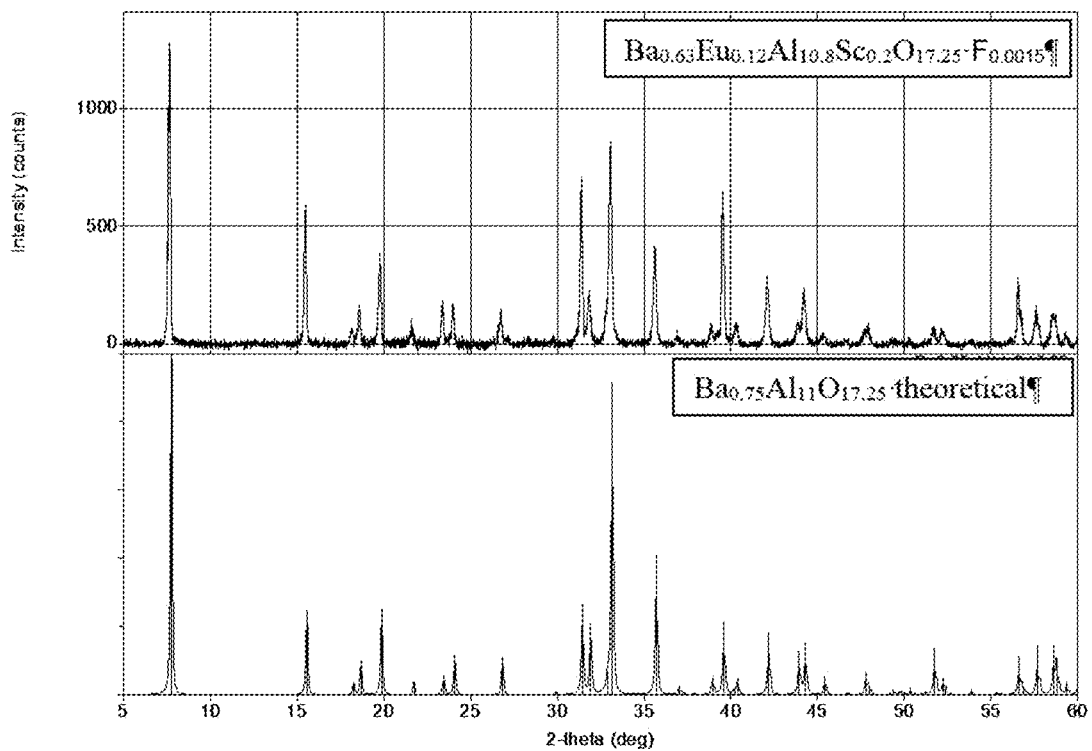
FIG. 2: XRD pattern of $Ba_{0.63}Eu_{0.12}Al_{10.8}Sc_{0.2}O_{17.25} \cdot F_{0.0015}$ (example 2) showing the phase pure β-alumina structure.
Figure 3:
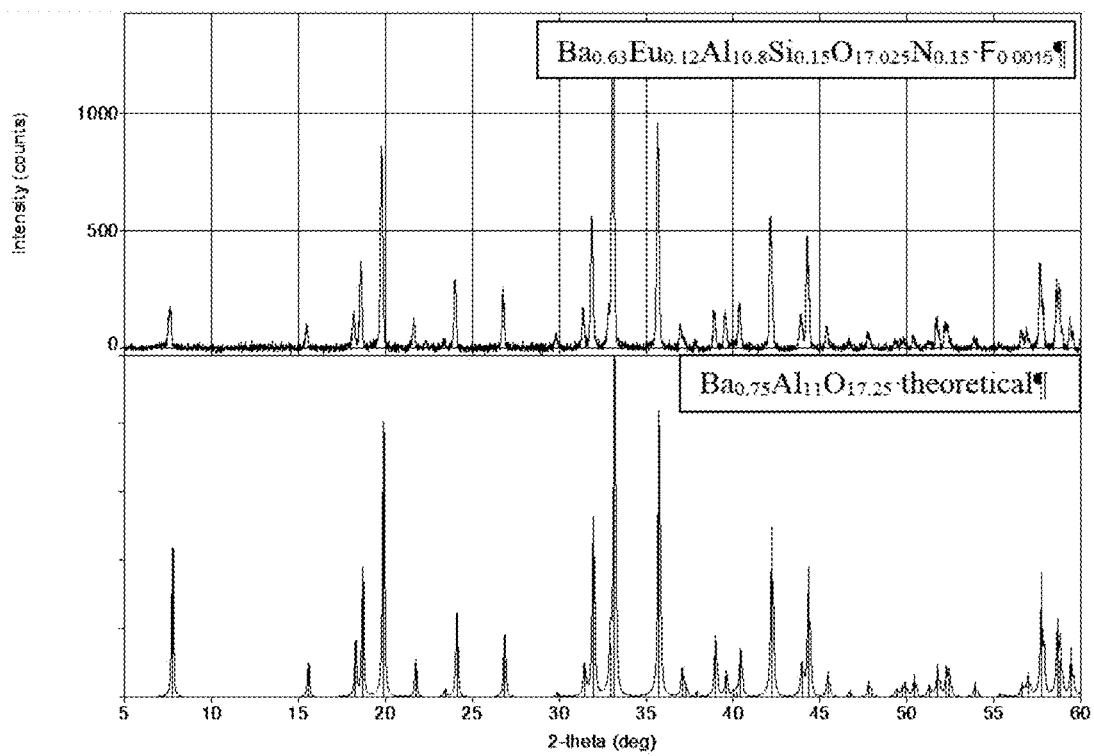
FIG. 3: XRD pattern of $Ba_{0.63}Eu_{0.12}Al_{10.8}Si_{0.15}O_{17.025}N_{0.15} \cdot F_{0.0015}$ (example 4) showing the phase pure β-alumina structure.
Figure 4:
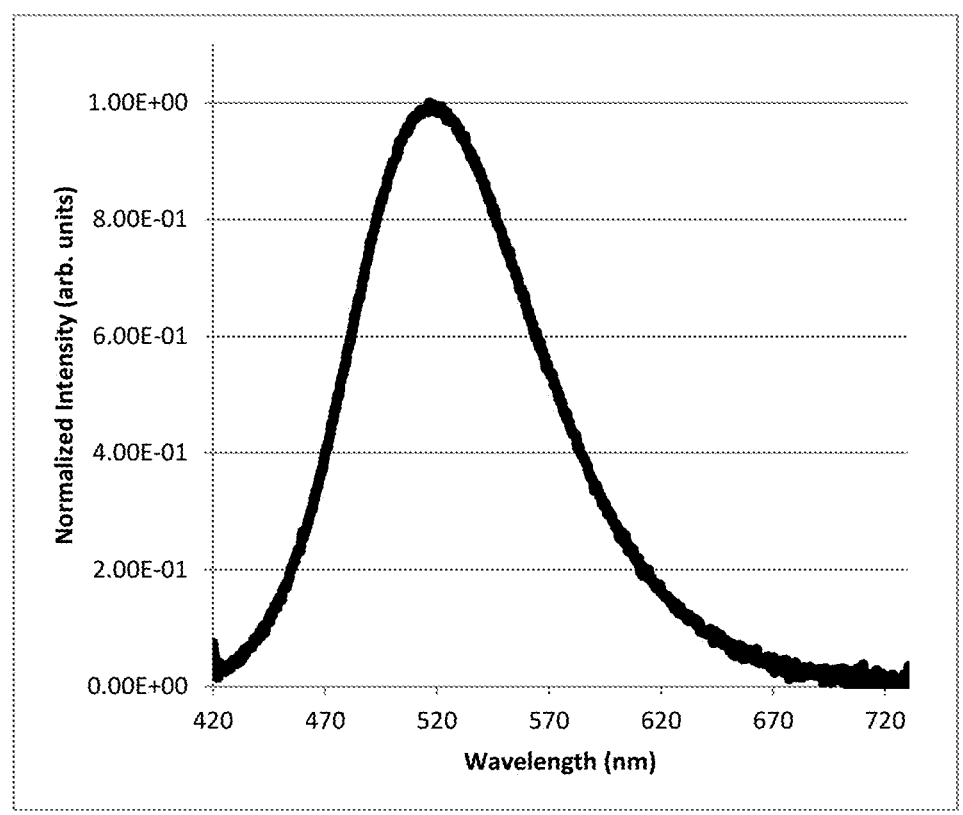
FIG. 4: Emission spectrum of $Ba_{0.63}Eu_{0.12}Al_{11}O_{17.25} \cdot F_{0.0015}$ (example 1) under excitation at 410 nm.
Figure 5:
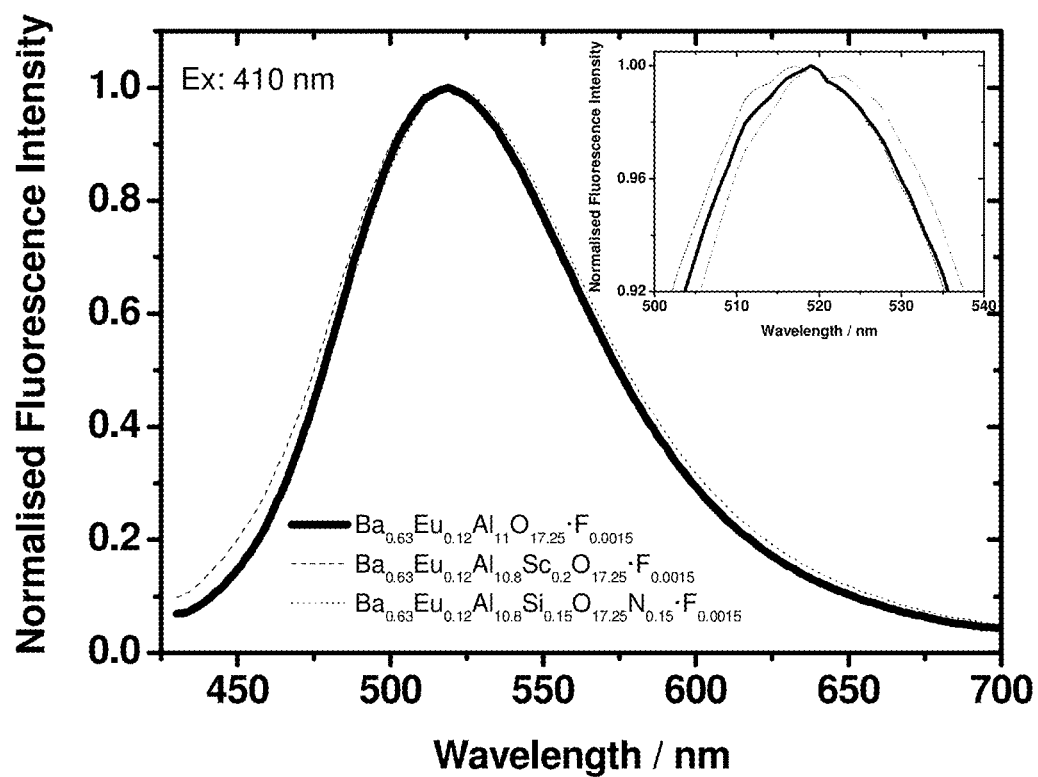
FIG. 5: Emission spectra of $Ba_{0.75}Al_{11}O_{17.25} \cdot F_{0.0015}$:Eu, $Ba_{0.75}Al_{11}O_{17.25} \cdot F_{0.0015}$:Eu,Sc, $Ba_{0.75}Al_{11}O_{17.25} \cdot F_{0.0015}$:Eu,Si,N (solid, dashed and dotted lines, respectively) under excitation at 410 nm.
Figure 6:
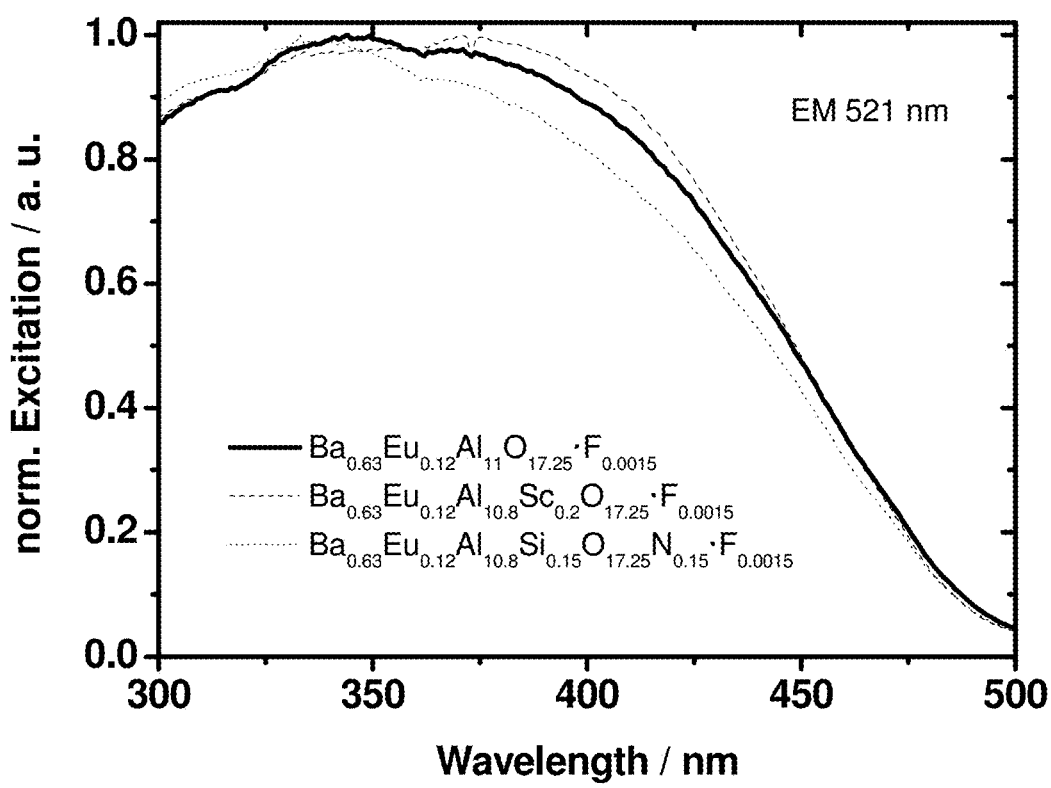
FIG. 6: Excitation spectra of $Ba_{0.75}Al_{11}O_{17.25} \cdot F_{0.0015}$:Eu, $Ba_{0.75}Al_{11}O_{17.25} \cdot F_{0.0015}$:Eu,Sc, $Ba_{0.75}Al_{11}O_{17.25} \cdot F_{0.0015}$:Eu,Si,N (solid, dashed and dotted lines, respectively) for emission at 521 nm.
Figure 7:
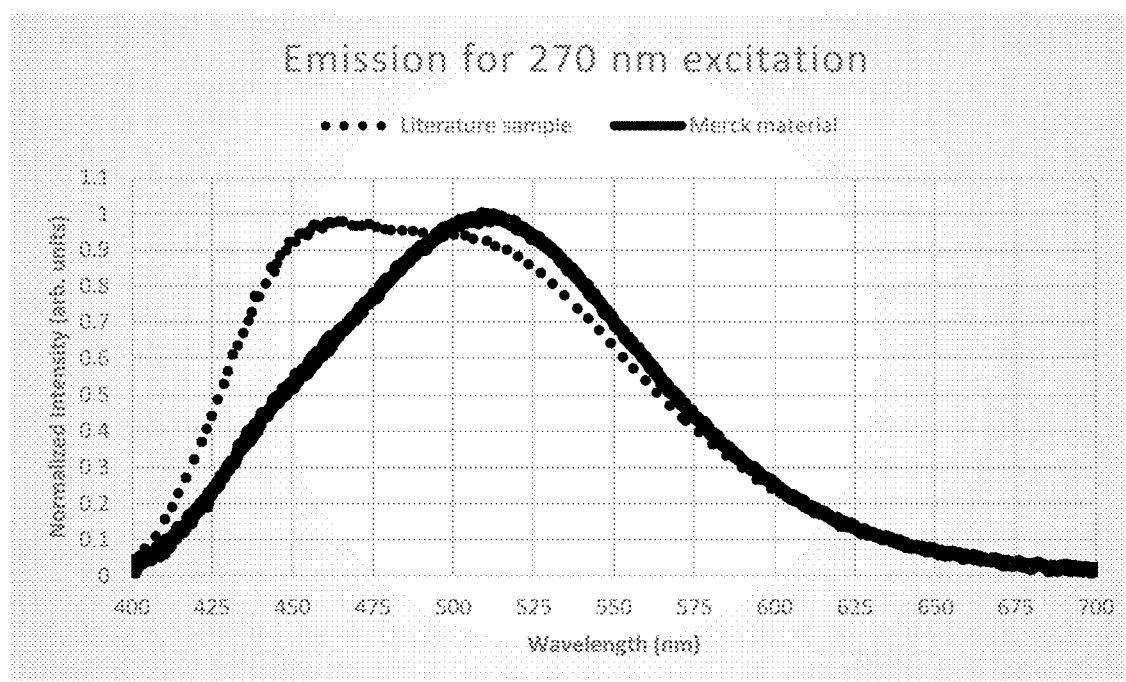
FIG. 7: Comparison of emission spectra of a sample according to the prior art ($Ba_{0.63}Eu_{0.12}Al_{11}O_{17.25}$) with the inventive material ($Ba_{0.63}Eu_{0.12}Al_{11}O_{17.25} \cdot F_{0.0015}$) under UV excitation at 270 nm.
Figure 8:
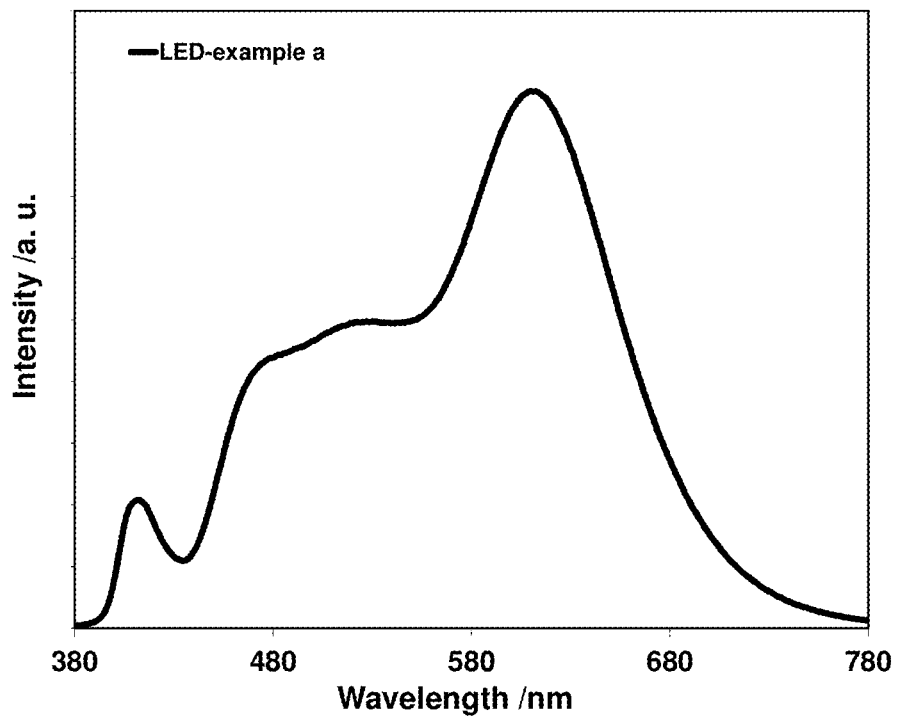
Figure 9:
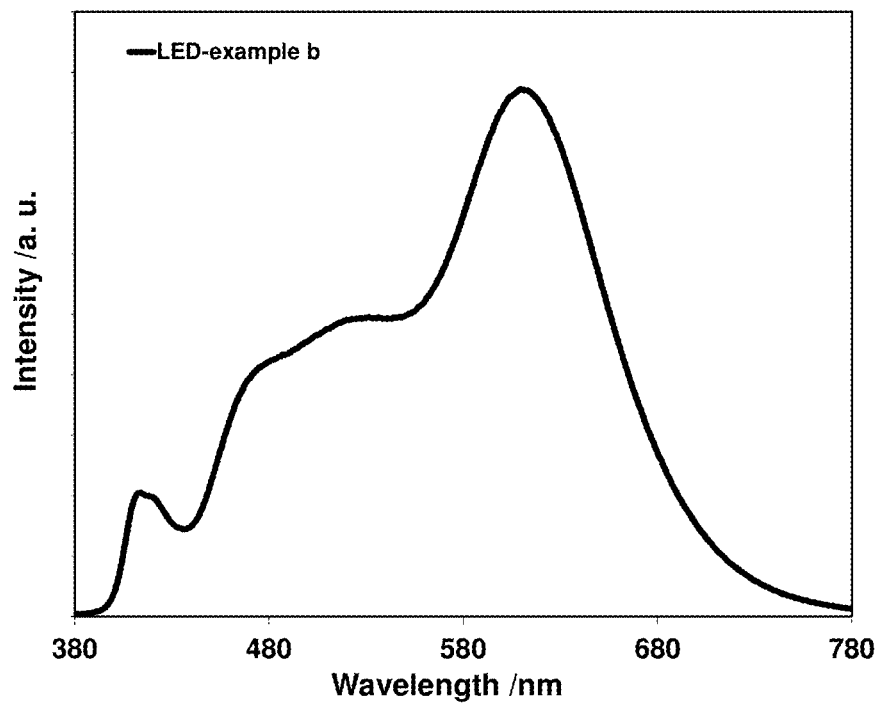
FIG. 9: Spectrum of the LED of example 33b.

The invention claimed is:

1. Compound of formula (1a), $$(AE)_{a-d-v}D_d M^1_{b-e}M^e_2 M^3_v E_{c-e}X_x N_{e+v} \qquad \text{Formula (1a)}$$

where the following applies to the symbols and indices used:
AE is Ca, Sr, Ba or mixtures thereof;
D is Eu, Mn, Yb, Sm, Ce or mixtures thereof;
$M^1$ is B, Al, Ga, In, Tl, Sc or mixtures thereof;
$M^2$ is C, Si, Ge, Sn or mixtures thereof;
$M^3$ is Y, Lu, La or mixtures thereof;
E is O, S, Se, Te or mixtures thereof;
X is F, Cl, Br, I or mixtures thereof;
N is a trivalent nitride ion;
$0.65 \leq a \leq 1$;
$0 \leq v \leq 0.1a$ where a is as defined above;
$10.667 \leq b \leq 11.133$;
$17.00 \leq c \leq 17.35$;
$0 < d \leq 1$;
$0 \leq x \leq 5$;
$0 \leq e \leq 5$;
$0.0584 \leq a/b \leq 0.0938$;
$0.0375 \leq a/c \leq 0.0588$;
$2a+3b=2c+x$;

with the proviso that x≠0 or v≠0 or e≠0 when AE=Ba and M¹=Al.

2. The compound according to claim 1 wherein AE is Ba, a mixture of Ba and Sr or a mixture of Ba and Ca, having a maximum of 10 atom-% of Sr or Ca, respectively, with respect to the total content of AE.

3. The compound according to claim 1 wherein D is selected from Eu or a mixture of Eu and Mn, which comprises a maximum of 10 atom-% of Mn with respect to the total amount of AE+Eu+Mn.

4. The compound according to claim 1 wherein M¹ is Al, mixtures of Al with Ga or In, and wherein the total amount of Ga or In, respectively, is ≤10 atom-% of the total amount of M¹.

5. The compound according to claim 1, wherein the compound is selected from the compounds of the formulae (2') to (11'), $$(Ba_{1-z}Sr_z)_{a-d}Eu_dM^1_{b-e}M^2_eE_{c-e}X_xN_e \qquad \text{Formula (2')}$$

$$(Ba_{1-z}Sr_z)_{a-d}(Eu,Mn)_dM^1_{b-e}M^2_eE_{c-e}X_xN_e \qquad \text{Formula (3')}$$

$$(Ba_{1-z}Ca_z)_{a-d}Eu_dM^1_{b-e}M^2_eE_{c-e}X_xN_e \qquad \text{Formula (4')}$$

$$(Ba_{1-z}Ca_z)_{a-d}(Eu,Mn)_dM^1_{b-e}M^2_eE_{c-e}X_xN_e \qquad \text{Formula (5')}$$

$$Ba_{a-d-v}Eu_dM^1_{b-e}M^2_eM^3_vE_{c-e}X_xN_{e+v} \qquad \text{Formula (6')}$$

$$Ba_{a-d-v}(Eu,Mn)_dM^1_{b-e}M^2_eM^3_vE_{c-e}X_xN_{e+v} \qquad \text{Formula (7')}$$

$$(AE)_{a-d-v}D_d(Al_{1-w}B_w)_{b-e}M^2_eM^3_vE_{c-e}X_xN_{e+v} \qquad \text{Formula (8')}$$

$$(AE)_{a-d-v}D_d(Al_{1-w}Ga_w)_{b-e}M^2_eM^3_vE_{c-e}X_xN_{e+v} \qquad \text{Formula (9')}$$

$$(AE)_{a-d-v}D_d(Al_{1-w}In_w)_{b-e}M^2_eM^3_vE_{c-e}X_xN_{e+v} \qquad \text{Formula (10')}$$

$$(AE)_{a-d-v}D_d(Al_{1-w}Sc_w)_{b-e}M^2_eM^3_vE_{c-e}X_xN_{e+v} \qquad \text{Formula (11')}$$

where the symbols and indices have the meanings given in claim 1 and
0<d≤1;
0≤z≤0.1; and
0≤w≤0.1.

6. The compound according to claim 1 wherein E is O, S or mixtures thereof.

7. The compound according to claim 1 wherein X is F, Cl or mixtures thereof, and wherein 0.001≤x≤0.1.

8. The compound according to claim 1 wherein 0.70≤a≤0.80.

9. The compound according to claim 1, of the formulae (2a') to (11a')

$$(Ba_{1-z}Sr_z)_{a-d}Eu_dM^1_{b-e}M^2_eO_{c-e}F_xN_e \qquad \text{Formula (2a')}$$

$$(Ba_{1-z}Sr_z)_{a-d}(Eu,Mn)_dM^1_{b-e}M^2_eO_{c-e}F_xN_e \qquad \text{Formula (3a')}$$

$$(Ba_{1-z}Ca_z)_{a-d}Eu_dM^1_{b-e}M^2_eO_{c-e}F_xN_e \qquad \text{Formula (4a')}$$

$$(Ba_{1-z}Ca_z)_{a-d}(Eu,Mn)_dM^1_{b-e}M^2_eO_{c-e}F_xN_e \qquad \text{Formula (5a')}$$

$$Ba_{a-d-v}Eu_dM^1_{b-e}M^2_eM^3_vO_{c-e}F_xN_{e+v} \qquad \text{Formula (6a')}$$

$$Ba_{a-d-v}(Eu,Mn)_dM^1_{b-e}M^2_eM^3_vO_{c-e}F_xN_{e+v} \qquad \text{Formula (7a')}$$

$$(AE)_{a-d-v}D_d(Al_{1-w}B_w)_{b-e}M^2_eM^3_vO_{c-e}F_xN_{e+v} \qquad \text{Formula (8a')}$$

$$(AE)_{a-d-v}D_d(Al_{1-w}Ga_w)_{b-e}M^2_eM^3_vO_{c-e}F_xN_{e+v} \qquad \text{Formula (9a')}$$

$$(AE)_{a-d-v}D_d(Al_{1-w}In_w)_{b-e}M^2_eM^3_vO_{c-e}F_xN_{e+v} \qquad \text{Formula (10a')}$$

$$(AE)_{a-d-v}D_d(Al_{1-w}Sc_w)_{b-e}M^2_eM^3_vO_{c-e}F_xN_{e+v} \qquad \text{Formula (11a')}$$

where the symbols and indices have the following meanings:
AE is Ba or mixtures of Ba with Ca or Ba with Sr where the maximum amount of Ca or Sr, respectively, is 10 atom-% with respect to the total amount of AE+D;
D is Eu or a mixture of Eu and Mn;
M¹ is B, Al, Ga, In, Sc or mixtures of two thereof;
M² is Si, Ge or mixtures thereof;
M³ is Y, Lu or La;
O is a divalent oxygen anion;
0.70≤a≤0.80;
0≤z≤0.05;
0.03≤d≤0.25;
19.93≤b≤11.067;
17.2≤c≤17.3;
with the proviso that x≠0 or e≠0 when z=0 and M¹=Al in formulae (2a) to (5a); and
furthermore with the proviso that x≠0 or v≠0 or e≠0 when M¹=Al in formulae (6a) and (7a);
and furthermore with the proviso that x≠0 or v≠0 or e≠0 when AE=Ba and w=0 in formulae (8a) to (11a).

10. A composition comprising a compound according to claim 1 that is coated.

11. A process for the preparation of a compound according to claim 1, comprising:
a) preparing a mixture comprising AE, D, M¹, E, optionally X and/or optionally M² and/or M³ and/or optionally N; and
b) calcining of the mixture at elevated temperature.

12. A light source which comprises at least one primary light source and at least one compound according to claim 1.

13. The light source according to claim 12 wherein the primary light source is a near-UV or violet LED diode and the light source comprises at least one compound emitting in the blue region of the spectrum, at least one compound emitting in the green region of the spectrum and at least one compound emitting in the orange or red region of the spectrum.

14. A The compound according to claim 1, functioning as a conversion phosphor emitting light of a longer wavelength than its excitation source wavelength.

15. The compound according to claim 5 wherein E is O, S or mixtures thereof.

16. The compound according to claim 5 wherein X is F, Cl or mixtures thereof, and wherein 0.001≤x≤0.1.

17. The compound according to claim 5 wherein 0.70≤a≤0.80.

* * * * *